US010453792B2

United States Patent
Reznicek et al.

(10) Patent No.: US 10,453,792 B2
(45) Date of Patent: Oct. 22, 2019

(54) HIGH DENSITY ANTIFUSE CO-INTEGRATED WITH VERTICAL FET

(71) Applicant: International Business Machines Corporation, Armonk, NY (US)

(72) Inventors: Alexander Reznicek, Troy, NY (US); Pouya Hashemi, White Plains, NY (US); Miaomiao Wang, Albany, NY (US); Takashi Ando, Tuckahoe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/926,369

(22) Filed: Mar. 20, 2018

(65) Prior Publication Data
US 2019/0295949 A1   Sep. 26, 2019

(51) Int. Cl.
*H01L 23/52* (2006.01)
*H01L 29/66* (2006.01)
*H01L 29/78* (2006.01)
*H01L 23/525* (2006.01)

(52) U.S. Cl.
CPC .... *H01L 23/5252* (2013.01); *H01L 29/66666* (2013.01); *H01L 29/7827* (2013.01); *H01L 29/7851* (2013.01)

(58) Field of Classification Search
CPC .......... H01L 23/5252; H01L 29/66666; H01L 29/7827; H01L 29/7851
See application file for complete search history.

(56) References Cited

U.S. PATENT DOCUMENTS

| | | | | |
|---|---|---|---|---|
| 8,035,191 B2 * | 10/2011 | Lin | ...................... | H01L 23/5256 257/529 |
| 8,053,809 B2 * | 11/2011 | Cheng | ................. | H01L 27/0629 257/173 |
| 8,896,088 B2 * | 11/2014 | Li | .......................... | H01L 21/84 257/529 |
| 8,981,525 B2 * | 3/2015 | Lee | ....................... | H01L 23/525 257/530 |
| 9,443,982 B1 * | 9/2016 | Balakrishnan | .... | H01L 29/66742 |
| 9,550,064 B2 | 1/2017 | Mashiach | | |
| 9,570,356 B1 * | 2/2017 | Balakrishnan | .............................. | H01L 21/823487 |
| 9,728,542 B1 * | 8/2017 | Balakrishnan | .... | H01L 29/66742 |
| 9,893,207 B1 * | 2/2018 | Balakrishnan | ...... | H01L 29/7889 |
| 10,229,919 B2 * | 3/2019 | Cheng | ............... | H01L 27/11206 |
| 2011/0108926 A1 * | 5/2011 | Bahl | ..................... | H01L 27/112 257/379 |
| 2017/0345829 A1 * | 11/2017 | Balakrishnan | .... | H01L 29/66742 |

OTHER PUBLICATIONS

Hashemi et al., "Controlled Vertical Transistor Flow," Sep. 2015, 24 pages.

* cited by examiner

*Primary Examiner* — Ida M Soward
(74) *Attorney, Agent, or Firm* — Patterson + Sheridan, LLP

(57) ABSTRACT

A semiconductor device including an anti-fuse is disclosed. The semiconductor anti-fuse includes a highly doped source of a first conductivity type overlying a substrate. The semiconductor anti-fuse further includes a counter-doped layer of a second conductivity type arranged between the highly doped source and the substrate. The semiconductor anti-fuse further includes a highly doped fuse region extending over the highly doped source and including an epitaxial growth, the highly doped fuse region implanted with ions.

12 Claims, 27 Drawing Sheets

US 10,453,792 B2

HIGH DENSITY ANTIFUSE CO-INTEGRATED WITH VERTICAL FET

BACKGROUND

The present invention relates to vertical complementary metal oxide semiconductor transistors (CMOS), and more specifically, to anti-fuses manufactured alongside vertical CMOS transistors.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions. Vertical nFET or pFET transistors are an attractive option for technology scaling for 5 nm and beyond.

Programmable on-chip anti-fuses are needed in many semiconductor integrated circuit applications. Anti-fuses are an important part of a technology offering, as it is used for applications such as memory array redundancy, post-manufacture programming of circuits, and package identification coding.

An anti-fuse is an electrical device that performs the opposite function of a fuse. Whereas a fuse initially has a low resistance and is designed to permanently break an electrically conductive path (typically when the current through the path exceeds a specified limit), an anti-fuse initially has a high resistance and is designed to permanently create an electrically conductive path (typically when the voltage across the anti-fuse exceeds a certain level).

In some applications, it preferable to fabricate on-chip anti-fuses during vertical FinFET CMOS fabrication in order to minimize process cost and improve system integration. The breakdown voltage of conventional planar anti-fuses with a gate dielectric is too high. Also, planar anti-fuses use too much area compatible with current ground rules of 14 nm, 10 nm, or 7 nm technology nodes.

Therefore, there is a need for improved on-chip anti-fuses co-integrated with vertical stacked FinFET CMOS transistors.

SUMMARY

According to one embodiment, a method of making a semiconductor device comprising a vertical transistor co-integrated with an anti-fuse includes forming a highly doped source of a first conductivity type overlying a substrate. The method further includes forming a counter-doped layer of a second conductivity type arranged between the highly doped source and the substrate. The method further includes forming a channel region extending over the highly doped source and comprising an epitaxial growth, the channel region located at a first location on the substrate and having a first width. The method further includes forming a drain comprising an epitaxial growth arranged on the channel region, the channel region extending from the source to the drain. The method further includes forming a highly doped fuse region extending over the highly doped source and comprising an epitaxial growth, the fuse region located at a second location on the substrate and having a second width that is larger than the first width.

According to another embodiment, a semiconductor device comprising a vertical transistor co-integrated with an anti-fuse includes a highly doped source of a first conductivity type overlying a substrate. The semiconductor device further includes a counter-doped layer of a second conductivity type arranged between the highly doped source and the substrate. The semiconductor device further includes a channel region extending over the highly doped source and comprising an epitaxial growth, the channel region located at a first location on the substrate and having a first width. The semiconductor device further includes a drain comprising an epitaxial growth arranged on the channel region, the channel region extending from the source to the drain. The semiconductor device further includes a highly doped fuse region extending over the highly doped source and comprising an epitaxial growth, the fuse region located at a second location on the substrate and having a second width that is larger than the first width.

According to another embodiment, a semiconductor device comprising an anti-fuse includes a highly doped source of a first conductivity type overlying a substrate. The anti-fuse further includes a counter-doped layer of a second conductivity type arranged between the highly doped source and the substrate. The anti-fuse further includes a highly doped fuse region extending over the highly doped source and comprising an epitaxial growth, the highly doped fuse region implanted with ions.

BRIEF DESCRIPTION OF THE SEVERAL VIEWS OF THE DRAWINGS

FIGS. 1-27 illustrate exemplary methods of making an anti-fuse structure co-integrated with a vertical transistor according to embodiments, in which:

FIG. 1 is a cross-sectional view and a top view of an initial starting semiconductor structure divided into a transistor region and an anti-fuse region;

FIG. 2 is a cross-sectional side view of the semiconductor structure after forming trenches in the transistor region and an anti-fuse region, respectively;

FIG. 3 is a cross-sectional side view of the semiconductor structure after oxidizing a portion of dummy gate sidewalls in the trenches;

FIG. 4 is a cross-sectional side view of the semiconductor structure after etching through the bottom spacer layer in the trenches to expose a highly doped source layer and form a self-aligned junction;

FIGS. 5A and 5B are a cross-sectional side view and a top view, respectively, of the semiconductor structure after growing an epitaxial layer on the highly doped source layer in a trench to form the epitaxial channel region in the transistor region;

FIG. 6 is a cross-sectional side view of the semiconductor structure after growing an epitaxial layer on a highly doped source layer in the trench to form an epitaxial fuse region in the anti-fuse region;

FIG. 7 is a cross-sectional side view of the semiconductor structure after heavily doping top portions of the epitaxial channels;

FIG. 8 is a cross-sectional side view of the semiconductor structure after filling a remaining portion of the trench in the anti-fuse region with a dielectric cap layer that matches the composition of the dielectric capping layer and then planarizing the epitaxial growth in the epitaxial channels;

FIG. 9 is a cross-sectional side view of the semiconductor structure after applying a hard mask layer to the dielectric capping layer in the anti-fuse region;

FIG. 10 is a cross-sectional side view of the semiconductor structure after partially recessing the epitaxial channel, filling with a dielectric material, and planarizing the dielectric material in the transistor region;

FIG. 11 is a cross-sectional side view of the semiconductor structure after removing the dielectric capping layer and forming an epitaxial growth on the epitaxial channel to form a drain in the transistor region;

FIG. 12 is a cross-sectional side view of the semiconductor structure after depositing a spacer on the epitaxial growth in the transistor region;

FIG. 13 is a cross-sectional side view of the semiconductor structure after removing a portion of the bottom spacer layer and dummy gate in the transistor region;

FIG. 14 is a cross-sectional side view of the semiconductor structure after removing a portion of the hard mask layer selective to the dielectric capping layer in the anti-fuse region;

FIG. 15 is a cross-sectional side view of the semiconductor structure after removing a portion of the dielectric capping layer in the anti-fuse region to form a trench;

FIG. 16 is a cross-sectional side view of the semiconductor structure after removing another portion of the dielectric capping layer selective to the epitaxial channel and the top spacer layer in the anti-fuse region to form an opening and an opening that forms the trench.

FIG. 17 is a cross-sectional side view of the semiconductor structure after forming a dielectric layer aligned with the sidewalls of the dummy gate and overlying the epitaxial channel and in the opening of the anti-fuse region;

FIG. 18 is a cross-sectional side view of the semiconductor structure after removing the remaining dielectric capping layer in the anti-fuse region;

FIG. 19 is a cross-sectional side view of the semiconductor structure after removing the remaining dummy gate material beneath the spacer to expose the oxide in the transistor region, and removing the remaining portions of the hard mask layer in the anti-fuse region;

FIG. 20 is a cross-sectional side view of the semiconductor structure after removing the dummy gate oxide layer to expose the epitaxial channel in the transistor region, and after removing the dielectric layer to expose the epitaxial channel in the anti-fuse region;

FIG. 21 is a cross-sectional side view of the semiconductor structure after depositing a gate dielectric material and a work function metal in the transistor region and the anti-fuse region;

FIG. 22 is a cross-sectional side view of the semiconductor structure after filling with a metal gate material and planarizing the metal gate material in both the transistor region and the anti-fuse region;

FIG. 23 is a cross-sectional side view of the semiconductor structure after partially recessing the metal gate material in both the transistor region and the anti-fuse region;

FIG. 24 is a cross-sectional side view of the semiconductor structure after further etching the gate dielectric material and the work function metal in the transistor region;

FIG. 25 is a cross-sectional side view of the semiconductor structure after performing gate lithography and etching to form the gate in the transistor region;

FIG. 26 is a cross-sectional side view of the semiconductor structure after depositing an interlayer dielectric (ILD) on the gate in the transistor region; and FIG. 27 is a cross-sectional side view of the semiconductor structure after forming one or more contacts in the transistor region and the anti-fuse region.

DETAILED DESCRIPTION

Figure 1:
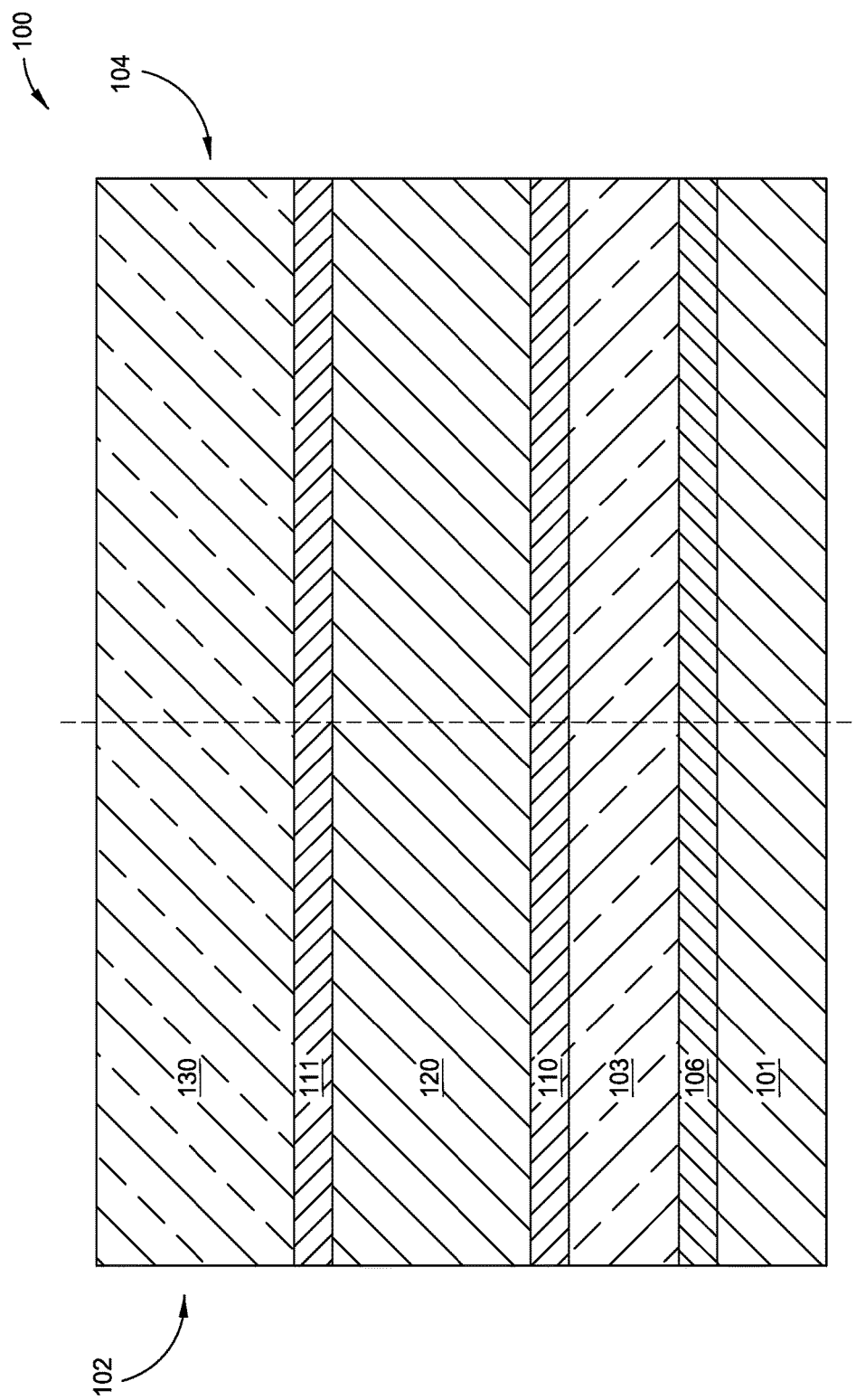

Accordingly, various embodiments provide a semiconductor structure comprising one or more vertical FinFET structures co-integrated with one or more semi-conductor anti-fuses and a method of making same. Embodiments of the present disclosure employ a geometric design of the anti-fuse that has a triangular shape that enhances characteristics of breakthrough voltage and current. These enhanced anti-fuse structures use same integration method as current FinFET CMOS structures, making the resulting anti-fuse highly integrable with vertical transistors for current technology needs.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Turning now to the Figures, FIGS. 1-27 illustrate an exemplary method of making a semiconductor structure comprising one or more vertical FinFET structures co-integrated with one or more semi-conductor anti-fuses according to embodiments.

FIG. 1 is a cross-sectional view of an initial starting semiconductor structure 100 divided into a transistor region 102 and an anti-fuse region 104 indicated by the dashed line. The transistor region 102 may be immediately adjacent to the anti-fuse region 104, or may be separated from each other by one or more components. The initial starting semiconductor structure 100 may comprise a dummy gate 120 and dielectric capping layer 130 arranged on a substrate 101 (bulk substrate). The substrate 101 includes one or more semiconductor materials. Non-limiting examples of suitable substrate 101 materials include Si (silicon), strained Si, Si:C (silicon carbon), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnSe (zinc selenide), ZnS (zinc sulfide), or ZnTe (zinc telluride)), or any combination thereof. In an exemplary embodiment, the substrate 101 includes germanium so that the channel region has both electron and hole mobility properties.

A heavily doped source layer 103 is arranged on the substrate 101 over a counter-doped layer 106. The heavily doped source layer 103 and the counter-doped layer 106 are formed on the substrate 101 incorporating dopants into the substrate 101 or forming an epitaxial growth on the substrate 101. The heavily doped source layer 103 is heavily doped with a dopant, which may be a p-type dopant (e.g., boron or gallium) or an n-type dopant (e.g., phosphorus or arsenic). The counter-doped layer 106 includes a dopant that is different/opposite the dopant in the heavily doped source layer 103. For example, when the heavily doped source layer 103 includes a p-type dopant, the counter-doped layer 106 includes an n-type dopant, and when the heavily doped source layer 103 includes an n-type dopant, the counter-doped layer 106 includes a p-type dopant. The counter-doped layer 106 has a dopant concentration in a range from about $5 \times 10^{18}$ to about $5 \times 10^{19}$ atoms/cm$^3$. The heavily doped source layer 103 has a dopant concentration in a range from about $4 \times 10^{20}$ to about $2 \times 10^{22}$ atoms/cm$^3$. The thickness of the counter-doped layer 106 may be in a range from about 5 to about 50 nm, or from about 10 to about 20 nm. The thickness of the heavily doped source layer 103 may be in a range from about 50 to about 250 nm, or from about 100 to about 200 nm.

A dummy gate layer 120 (later on in the process the dummy gate layer 120 is severed into several pieces and hereinafter referred to as a dummy gate) a dummy gate layer, once we cut it in pieces, it will become the dummy gate) is disposed on the heavily doped source layer 103 between a bottom spacer layer 110 and a top spacer layer 111. The bottom spacer layer 110 is deposited on the highly doped source layer 103, the dummy gate layer 120 is deposited on the bottom spacer layer 110, and the top spacer layer 111 is deposited on the dummy gate 120.

The bottom spacer layer 110 and top spacer layer 111 may include an insulating material, for example, silicon dioxide, silicon nitride, SiOCN, or SiBCN. Other non-limiting examples of materials for the bottom spacer layer 110 and the top spacer layer 111 include dielectric oxides (e.g., silicon oxide), dielectric nitrides (e.g., silicon nitride), dielectric oxynitrides, or any combination thereof. The bottom spacer layer 110 and top spacer layer 111 materials are deposited by a deposition process, for example, chemical vapor deposition (CVD) or physical vapor deposition (PVD). The bottom spacer layer 110 and the top spacer layer 111 may each have a thickness of about 3 to about 15 nm, or of about 5 to about 10 nm.

The dummy gate layer 120 includes a sacrificial gate material, for example, amorphous silicon (a-Si) or polycrystalline silicon (poly-silicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the dummy gate layer 120 has a thickness of about 20 to about 100, or from about 30 to about 70 nm.

A dielectric capping layer 130 is deposited on the top spacer layer 111 over the dummy gate 120. Non-limiting examples of materials for the dielectric capping layer 130 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 130 has a thickness in a range from about 30 to about 200 nm, or from about 50 to about 100 nm.

Figure 2:
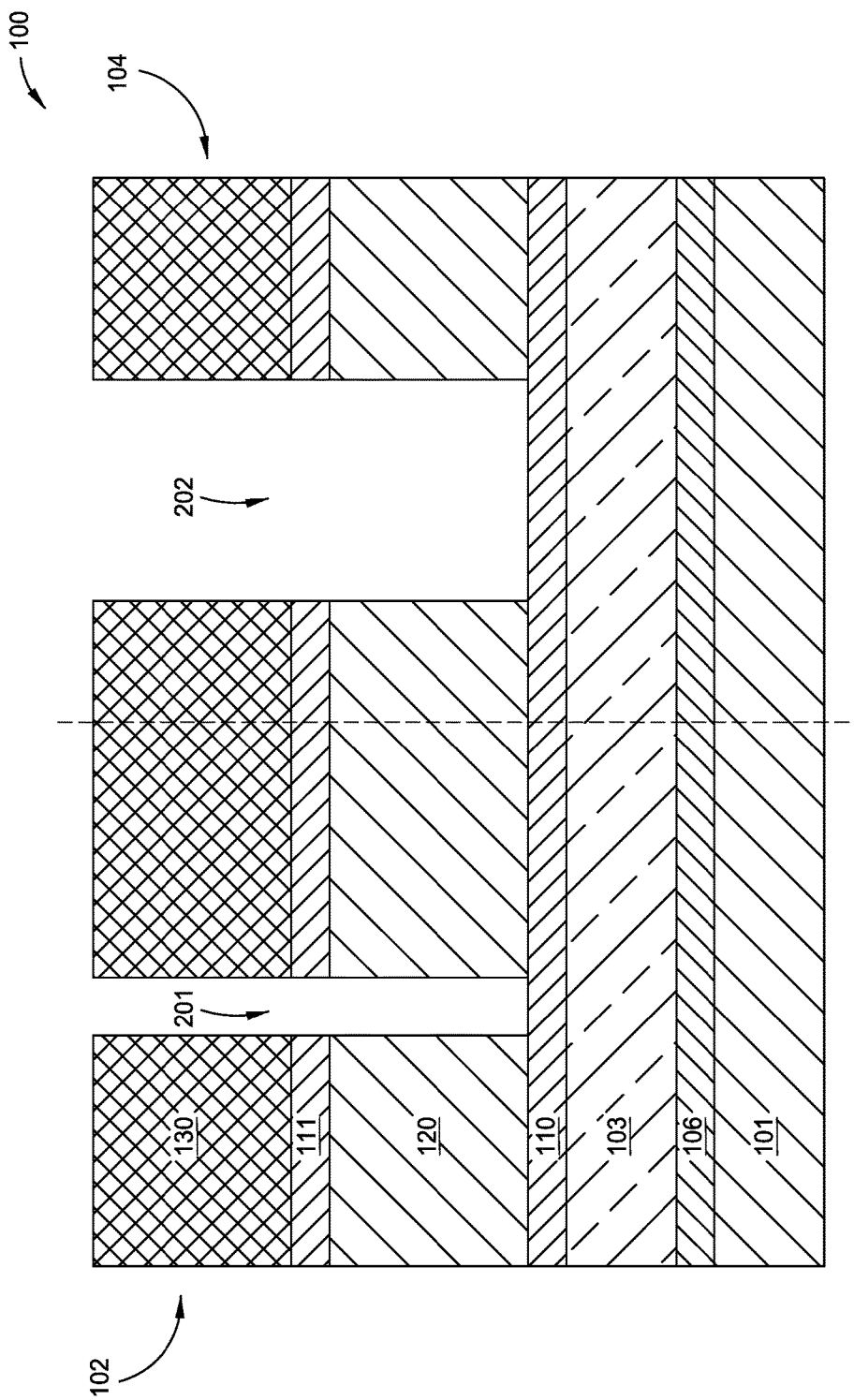

FIG. 2 is a cross-sectional side view of the semiconductor structure 100 after forming trenches 201, 202 in the transistor region 102 and an anti-fuse region 104, respectively. The trenches 201, 202 are each formed through the dielectric capping layer 130, second spacer 111, and the dummy gate 120 to expose the top spacer layer 110. The trenches 201, 202 extend from a surface of the dielectric capping layer 130 to the bottom spacer layer 110, exposing the bottom spacer layer 110. The trenches 201, 202 are formed by performing an etch process that is selective to (will not substantially remove) the bottom spacer layer 110 material. The etch process may be, for example, a reactive ion etch. Multiple etching processes are performed to form an opening/trench within the structure 100. For example, a first etching process is performed to remove a portion of the dielectric capping layer 130 selective to the material of the top spacer layer 111. A second etching process is then performed to remove a portion of the top spacer layer 111, which underlies the portion of the trenches 201, 202 formed from the first etching process, selective to the material of the dummy gate layer 120. A third etching process is then performed to remove a portion of the dummy gate layer 120, which underlies the portion of the trenches 201, 202 formed from the second etching process, selective to the material of the bottom spacer layer 110. The resulting trenches 201, 202 extend through a top surface of the dielectric capping layer 130 down to a top surface of an exposed portion of the bottom spacer layer 110. The width of the trench 201 may be about 3 to about 20 nm, or about 5 to about 10 nm. The width of the trench 202 is wider than the width of the trench 201, in the range from about 10 to about 30 nm. The depth of the trenches 201, 202 may be about 50 to about 300 nm, or from about 100 to about 200 nm. In an example, the width of the trench 202 and therefore the resulting width of the manufactured anti-fuse in the anti-fuse region may be varied. This variation of anti-fuse proportionally varies fuse current/breakthrough voltage.

Figure 3:
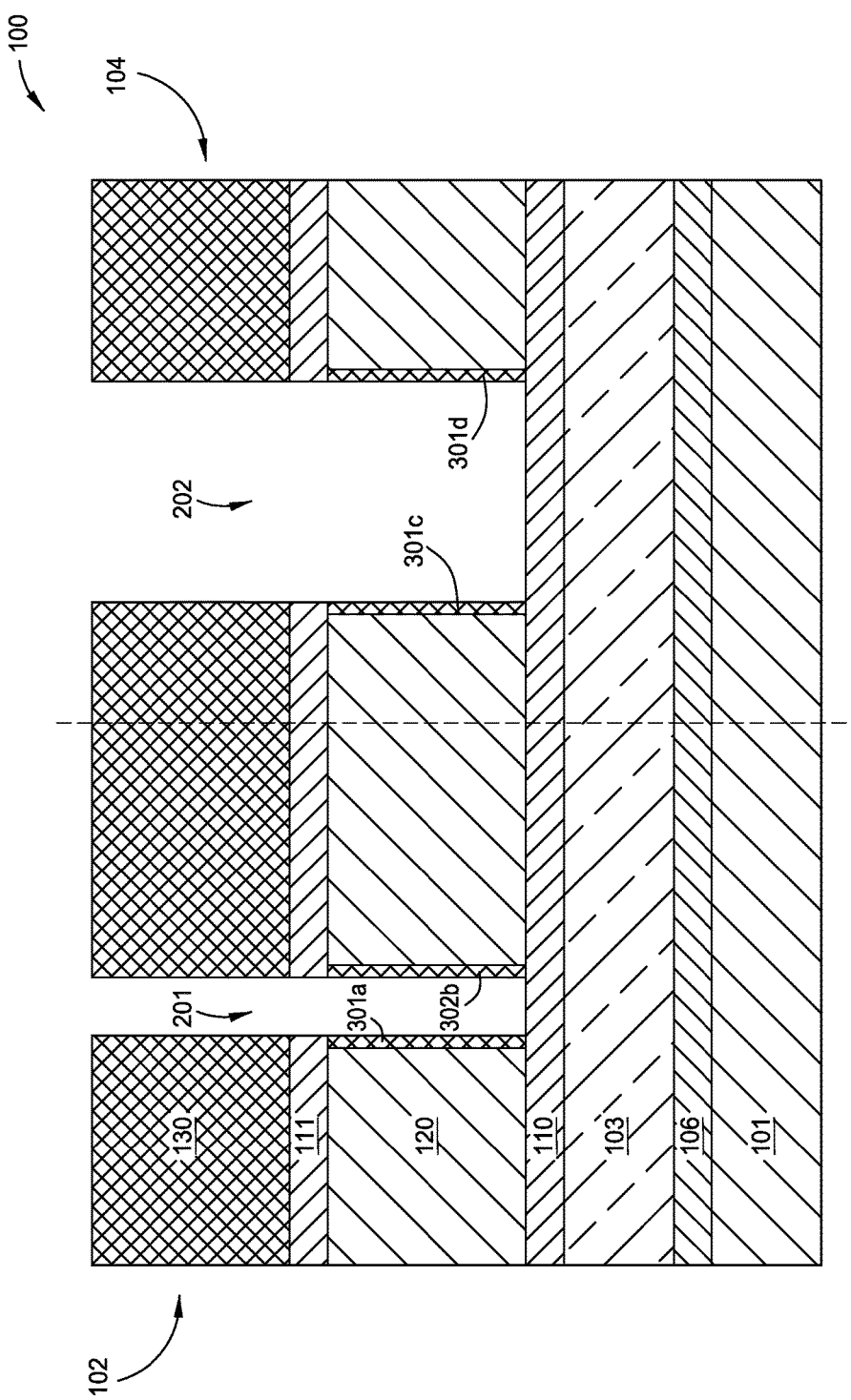

FIG. 3 is a cross-sectional side view of the semiconductor structure 100 after oxidizing a portion of the dummy gate layer 120 sidewalls in the trenches 201, 202. A thin layer of oxide layer 301a-301d is formed along the sidewalls in each of the trenches 201, 202. The oxidation may be performed by a plasma oxidation process or other oxidation process that forms a thin oxide layer 301a-301d. A portion of the bottom spacer 110 or the highly doped source layer 103 also may be oxidized. Any oxide formed in these regions is removed before performing an epitaxial growth process.

Figure 4:
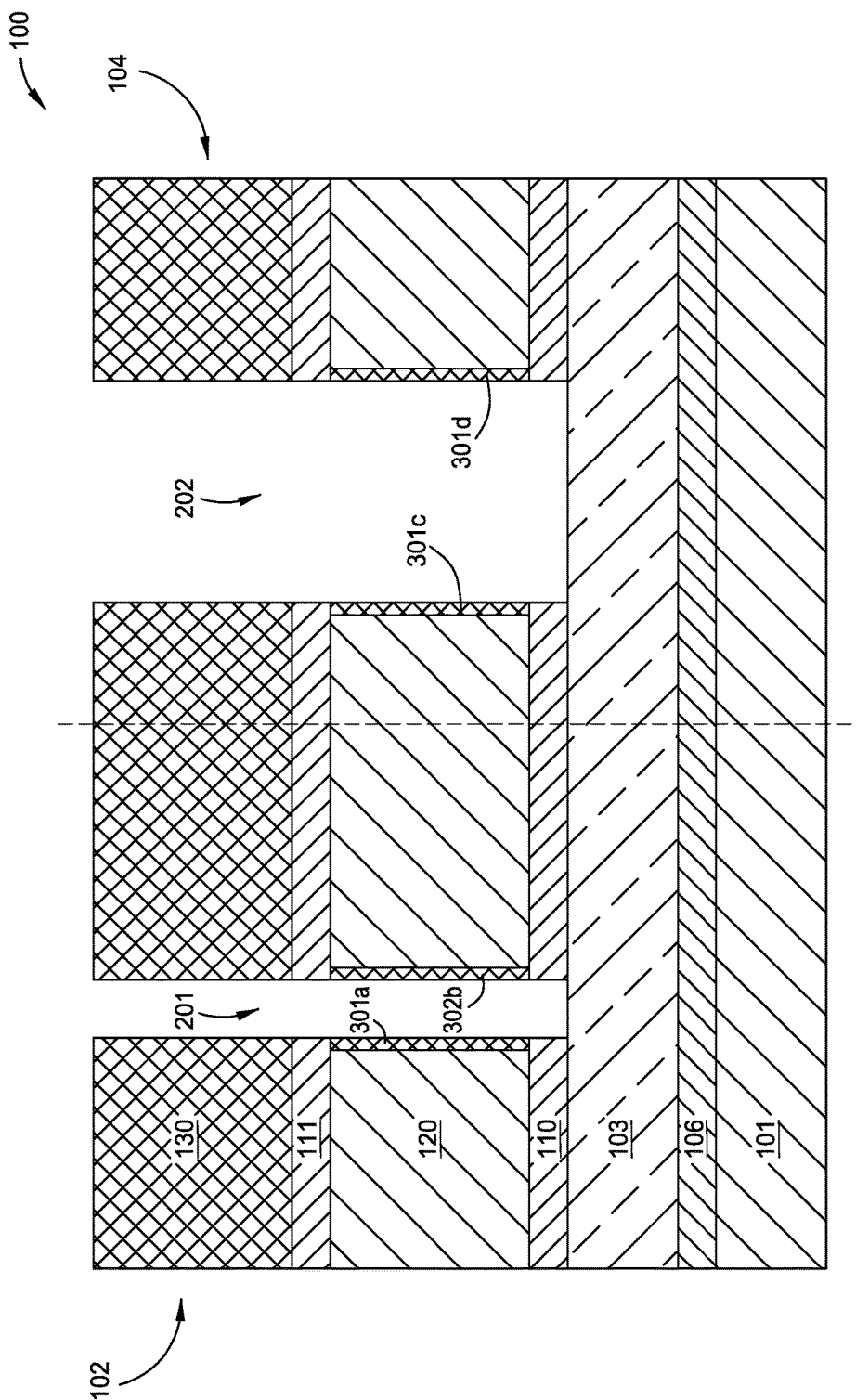
Figure 5:
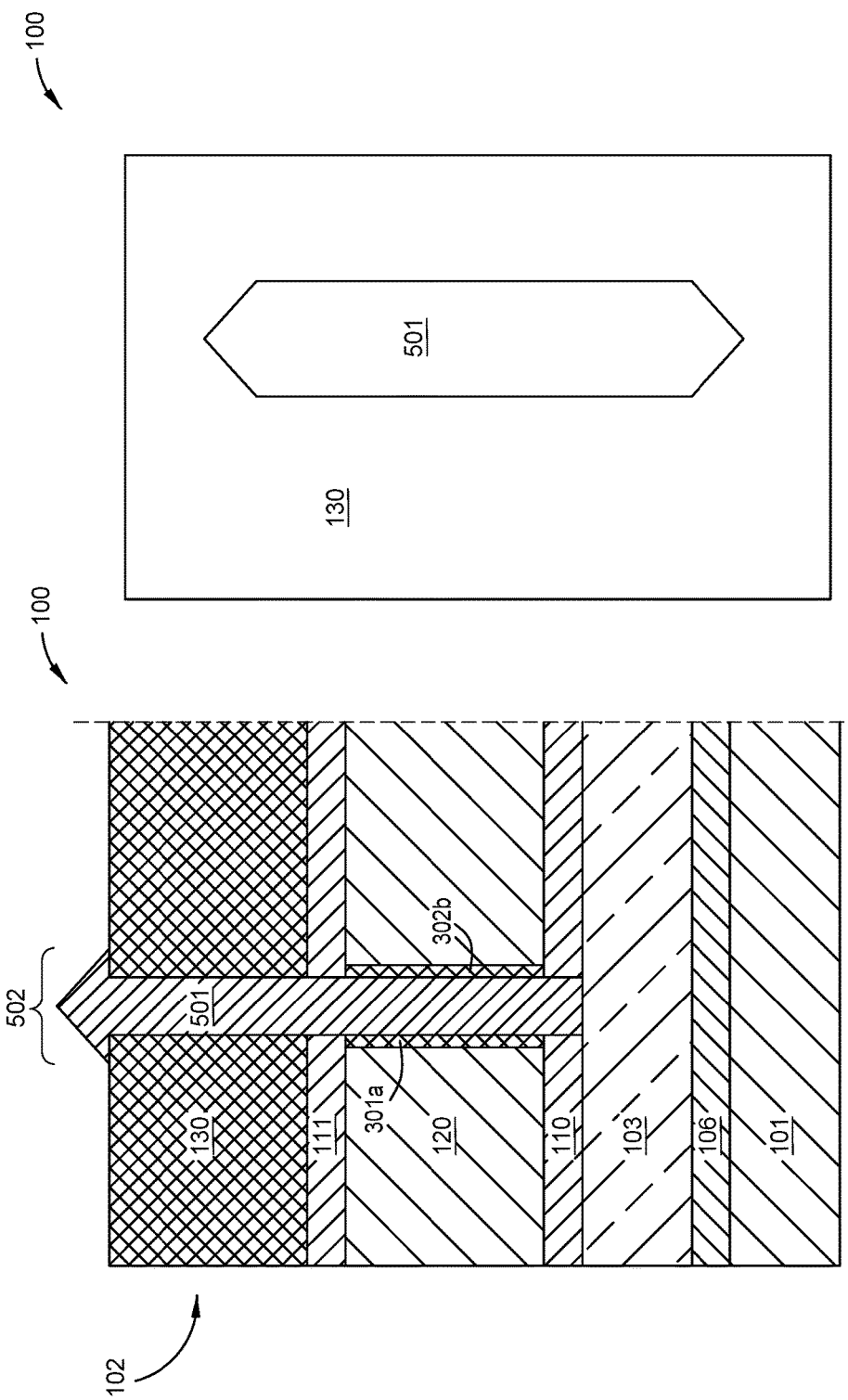

FIG. 4 is a cross-sectional side view of the semiconductor structure 100 after etching through the bottom spacer layer 110 in the trenches 201, 202 to expose the highly doped source layer 103 and form a self-aligned junction. The bottom spacer layer 110 may etched using a process that is selective to (will not substantially remove) the doped source 103 material. The bottom spacer layer 110 may be etched by, for example, a reactive ion etch (ME). The exposed portion of the bottom spacer layer 110 is removed by an etching process to expose a portion of the underlying source contact layer. This creates a self-aligned junction because a source extension can be epitaxially grown from the source layer to a top surface of the bottom spacer layer 110.

FIGS. 5A and 5B are a cross-sectional side view and a top view, respectively, of the semiconductor structure 100 after growing an epitaxial layer on the highly doped source layer in the trench 201 to form the channel region 501 at a first location 502 in the transistor region 102. The epitaxial growth includes an epitaxial semiconductor material, and the epitaxial growth and/or deposition processes are selective to forming on semiconductor surface, and do not deposit material on other surfaces, such as the oxide layer 301a-301b, bottom spacer layer 110 or top spacer layer 111. The epitaxial growth in the channel region 501 extends over the dielectric capping layer 130.

Figure 6:
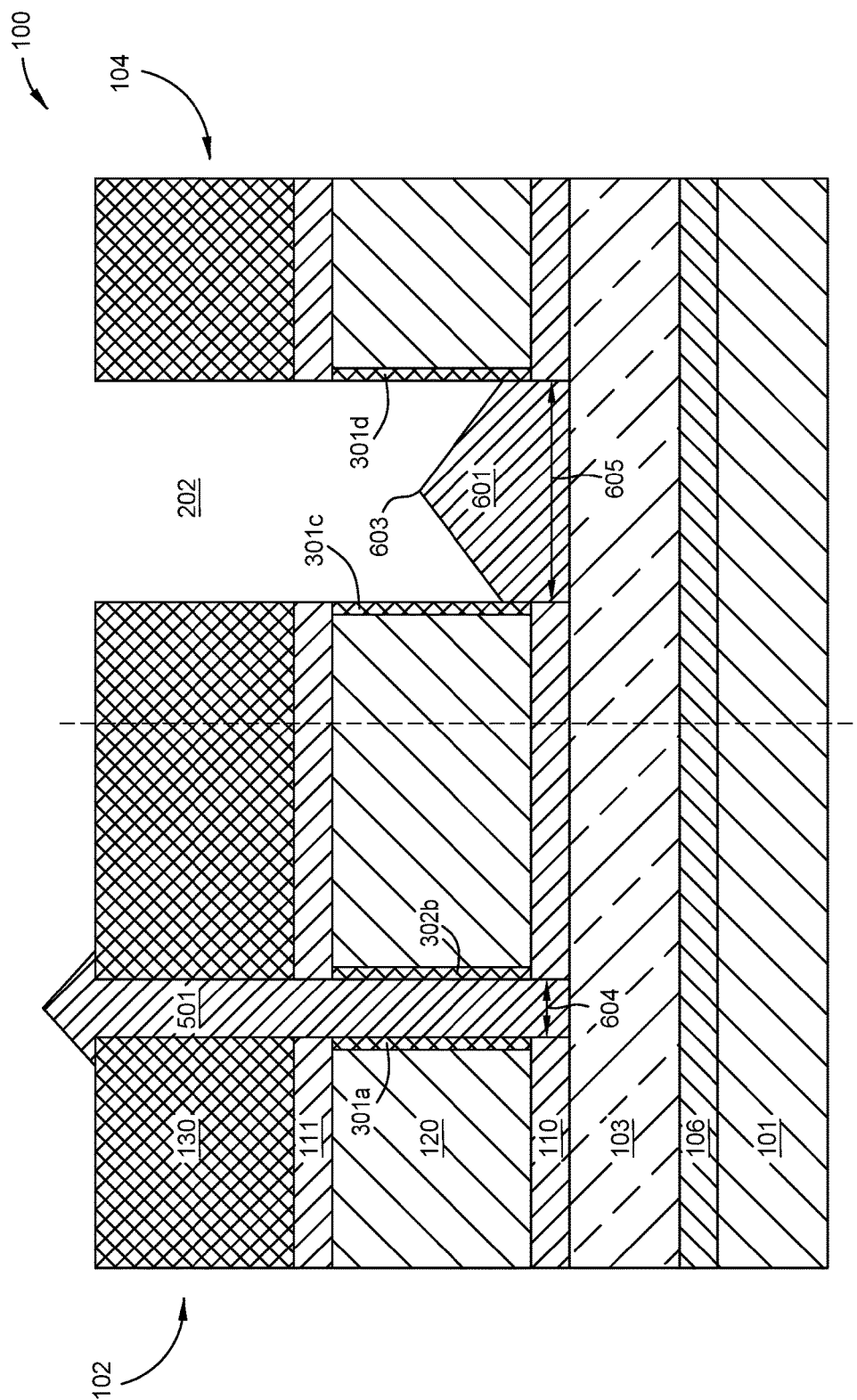

FIG. 6 is a cross-sectional side view of the semiconductor structure 100 after growing an epitaxial layer on the highly doped source layer in the trench 202 to form the fuse region 601 in the anti-fuse region 104. The fuse region 601 (also referred to as a highly doped fuse region 601) has a second width 605 that is larger than a first width 604 of the first channel region 501. The fuse region 601 includes an epitaxial semiconductor material, and the epitaxial growth and/or deposition processes are selective to forming on semiconductor surface, and do not deposit material on other surfaces, such as the oxide layer 301c-301d, bottom spacer layer 110, or top spacer layer 111. The epitaxial growth in the fuse region 601 extends partway through the height of the dummy gate layer 120. The epitaxial growth in the fuse region 601 may be grown at the same time as the epitaxial growth in the channel region 501. The epitaxial growth in the fuse region 601 may have a substantially triangular shape having an apex 603 where an active portion of an anti-fuse is to be located.

The regions 501, 601 may be grown using a suitable growth process, for example, chemical vapor deposition (CVD) (low pressure (LPCVD) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the regions 501, 601 material may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Figure 7:
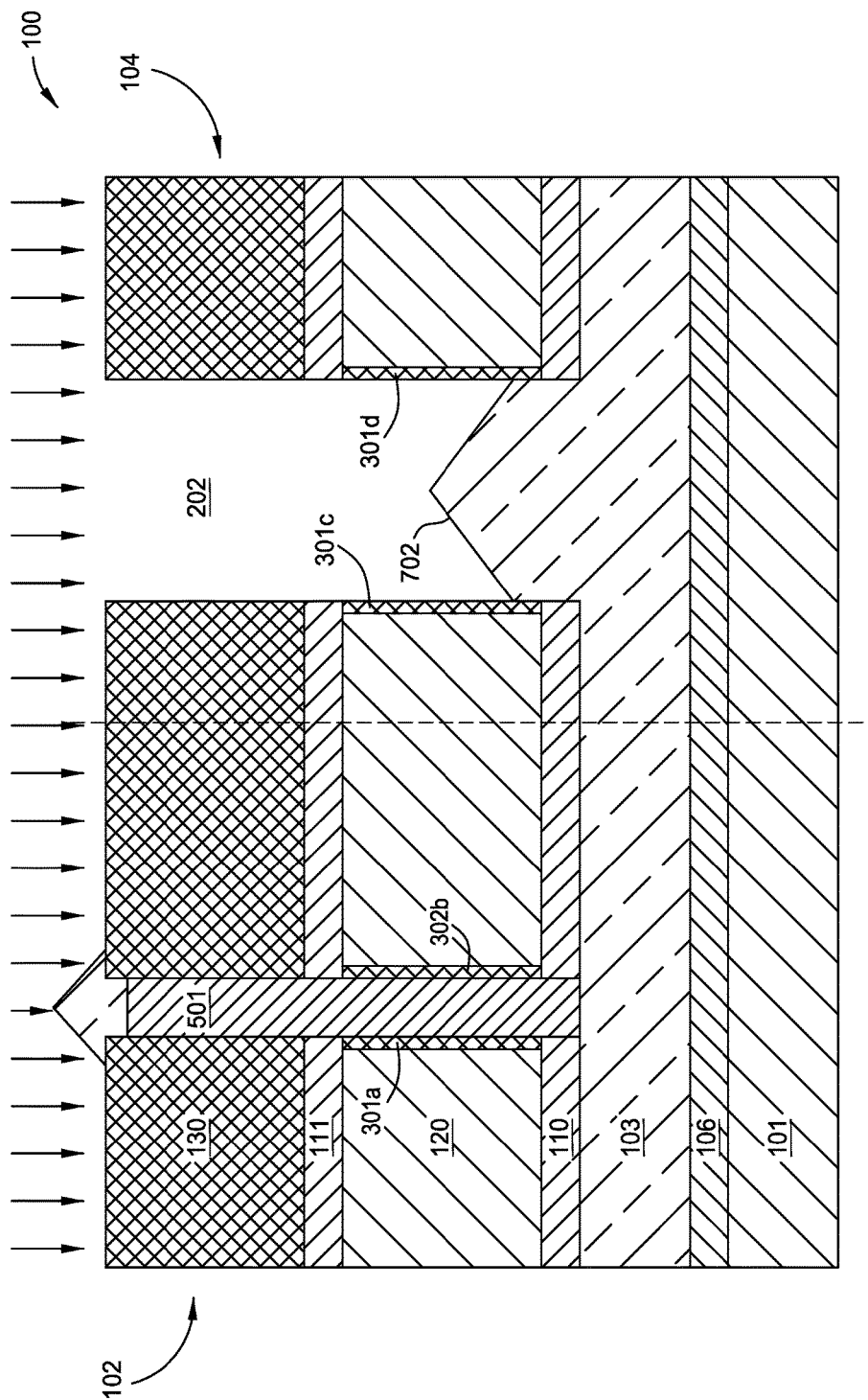

FIG. 7 is a cross-sectional side view of the semiconductor structure 100 after heavily doping top portions 701, 702 of the regions 501, 601. It is desirable that the fuse region 601 have low resistance to permit good conduction. The channel region 501 and the entirety of the fuse region 601 may be doped with implanted ions. Unfortunately, implanting these ions across the entirety of the regions 501, 601 inadvertently implants the upper portion of the channel region 501. This is not desirable, but fortunately the doped upper portion of the channel region 501 is removed in later steps of processing the semiconductor structure 100. The active portion of the channel region 501, which is located at the height of the dummy gate layer 120 does not see any implant species (since it is buried at a deeper level).

Suitable ions for implantation include epitaxial dopant atoms, B and Ga for p-doping, As or P for n-doping. The dopant concentration after ion implantation in fuse region 601 may be in the range about $4 \times 10^{20}$ to about $2 \times 10^{22}$ atoms/cm$^3$. An epitaxial overgrowth 704 and the upper portion of the channel region 501 in the transistor region 102 become implanted with ions, but the energy of the implant ions is such that a lower portion of the channel region 501, which is not removed in later processing steps, is protected from the implant ions.

Figure 8:
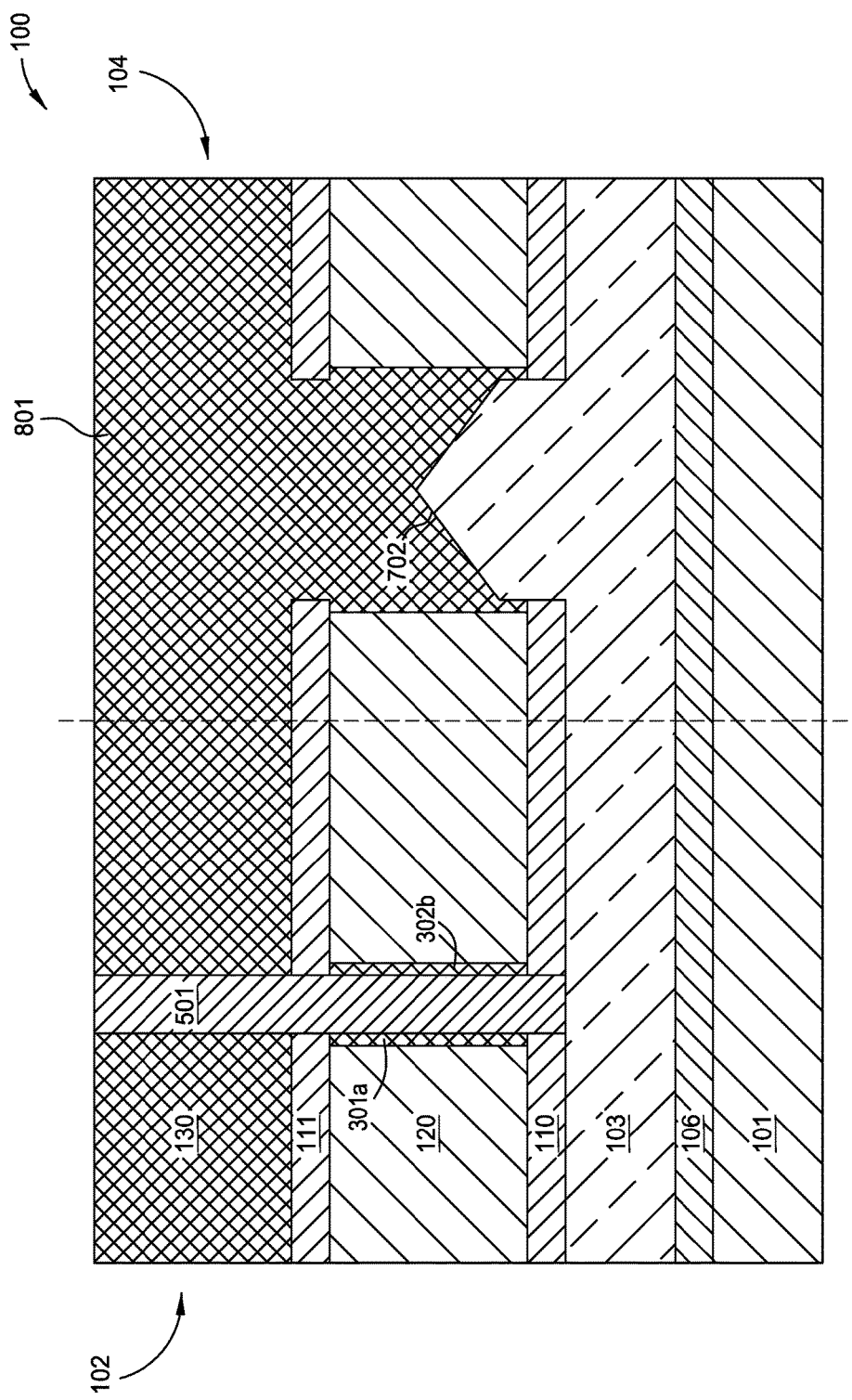

FIG. 8 is a cross-sectional side view of the semiconductor structure 100 after filling a remaining portion of the trench 202 in the anti-fuse region with a dielectric cap layer 801 that matches the composition of the dielectric capping layer 130 and then planarizing the epitaxial growth in the regions 501, 601. The planarization process may be a CMP process. Planarization removes excess (the implanted) epitaxial overgrowth 704 over the dielectric capping layer 130 in the transistor region 102. A small portion of the heavily doped top portion 701 of the channel region 501 may remain but is later removed.

Figure 9:
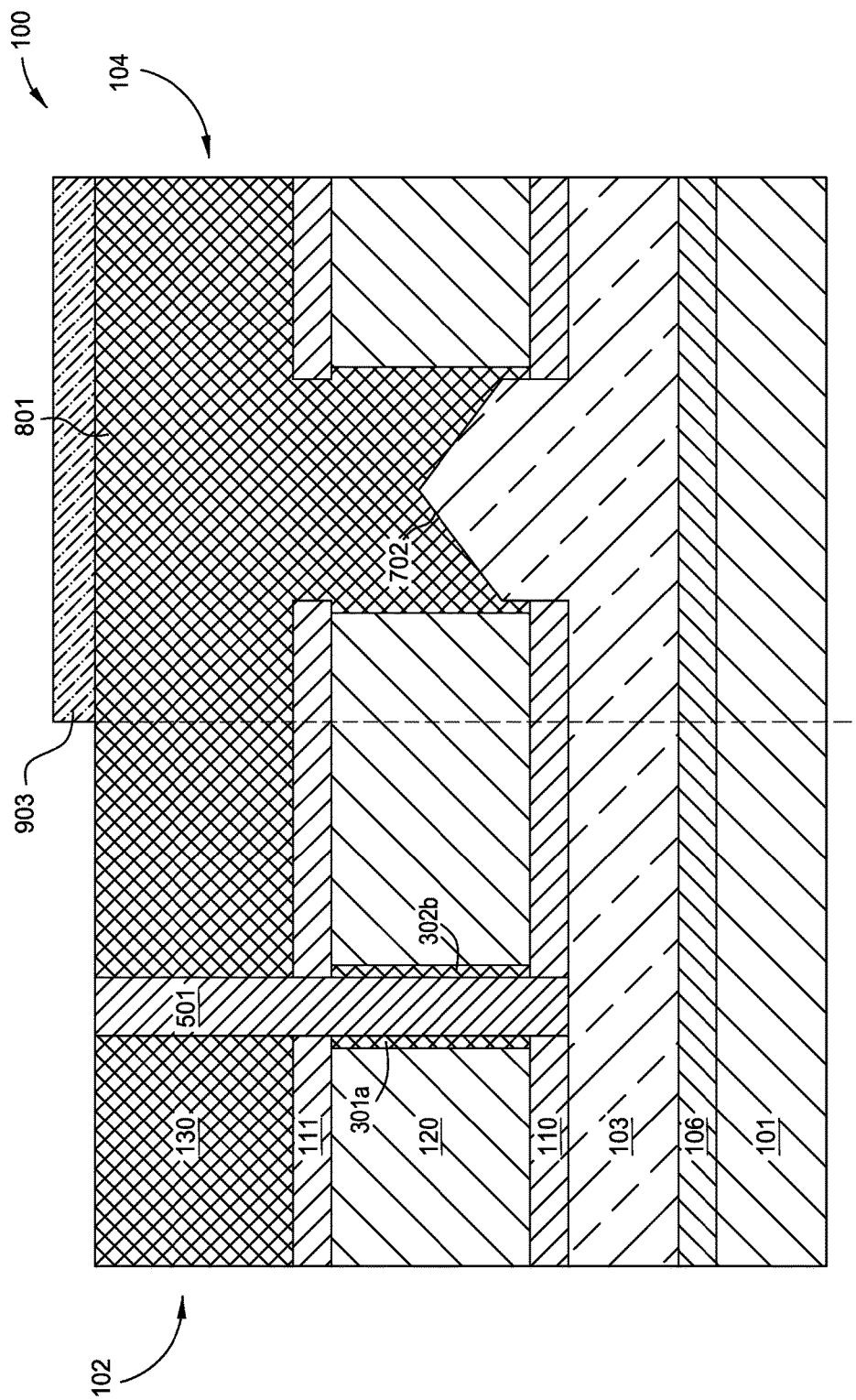

FIG. 9 is a cross-sectional side view of the semiconductor structure 100 after applying a hard mask layer 903 to the dielectric capping layer 130 in the anti-fuse region 104. Suitable masking materials include polymers such as silicon nitride.

Figure 10:
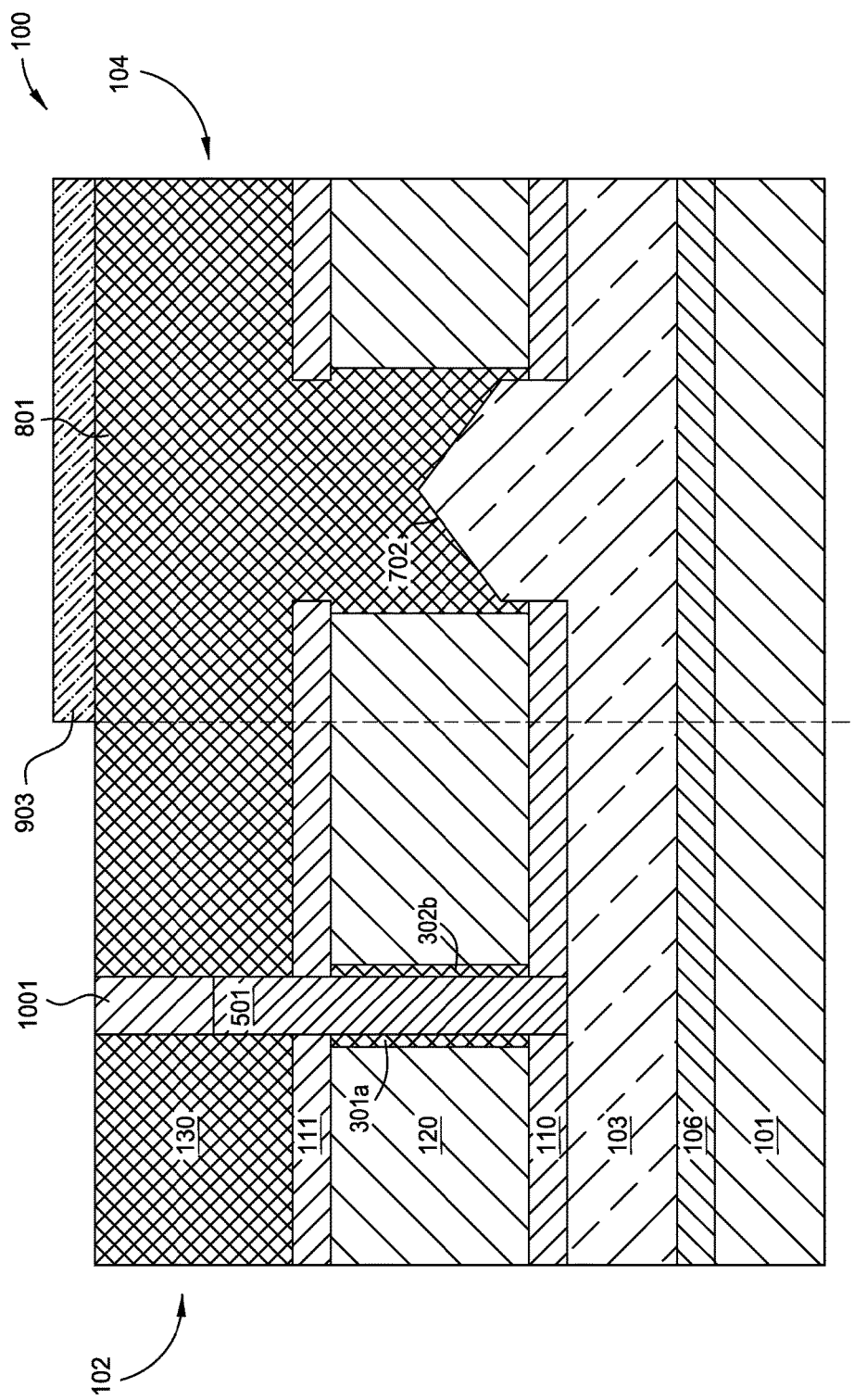

FIG. 10 is a cross-sectional side view of the semiconductor structure 100 after partially recessing the channel region 501 (to remove the implanted upper portion 503 of the channel region 501, filling with a dielectric material 1001, and planarizing the dielectric material 1001 in the transistor region 102. The channel region 501 is partially recessed to a level that is still within the dielectric capping layer 130 and over the second spacer 111. The channel region 501 is recessed by etching, for example, by a reactive ion etch or a wet etch process.

The recessed formed over the recessed channel region 501 is filled with a dielectric material. The dielectric material 701 may be a dielectric oxide (e.g., silicon oxide), a dielectric nitride (e.g., silicon nitride), a dielectric oxynitride, or any combination thereof. The dielectric material 701 is deposited by a deposition process, for example, chemical vapor deposition (CVD) or physical vapor deposition (PVD). After deposition, the dielectric 701 is planarized, by for example, CMP. The dielectric material 701 forms a dielectric cap.

Figure 11:
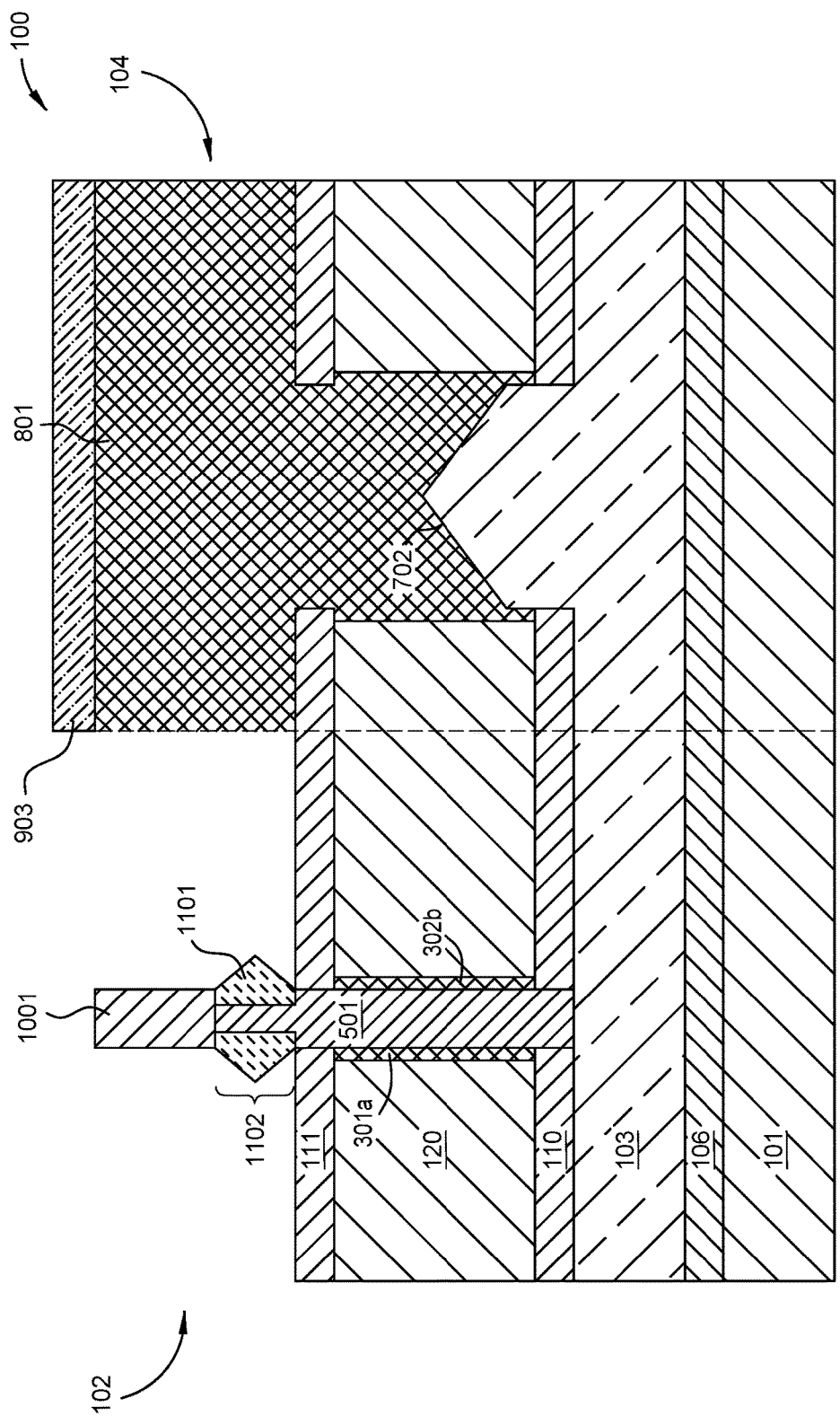

FIG. 11 is a cross-sectional side view of the semiconductor structure 100 after removing the dielectric capping layer 130 and forming an epitaxial growth 1101 on the epitaxial channel 501 to form a drain 1102 in the transistor region 102. The epitaxial growth 1101 of the drain 1102 is arranged between the dielectric material 1001 and the epitaxial channel 501. The epitaxial growth 1101 is also arranged between the dielectric cap and the dummy gate 120. A portion of the channel region 501 over the second spacer 111 may be recessed along sidewalls before forming the epitaxial growth 1101. The epitaxial growth 1101 forms the source/drain 1102.

Figure 12:
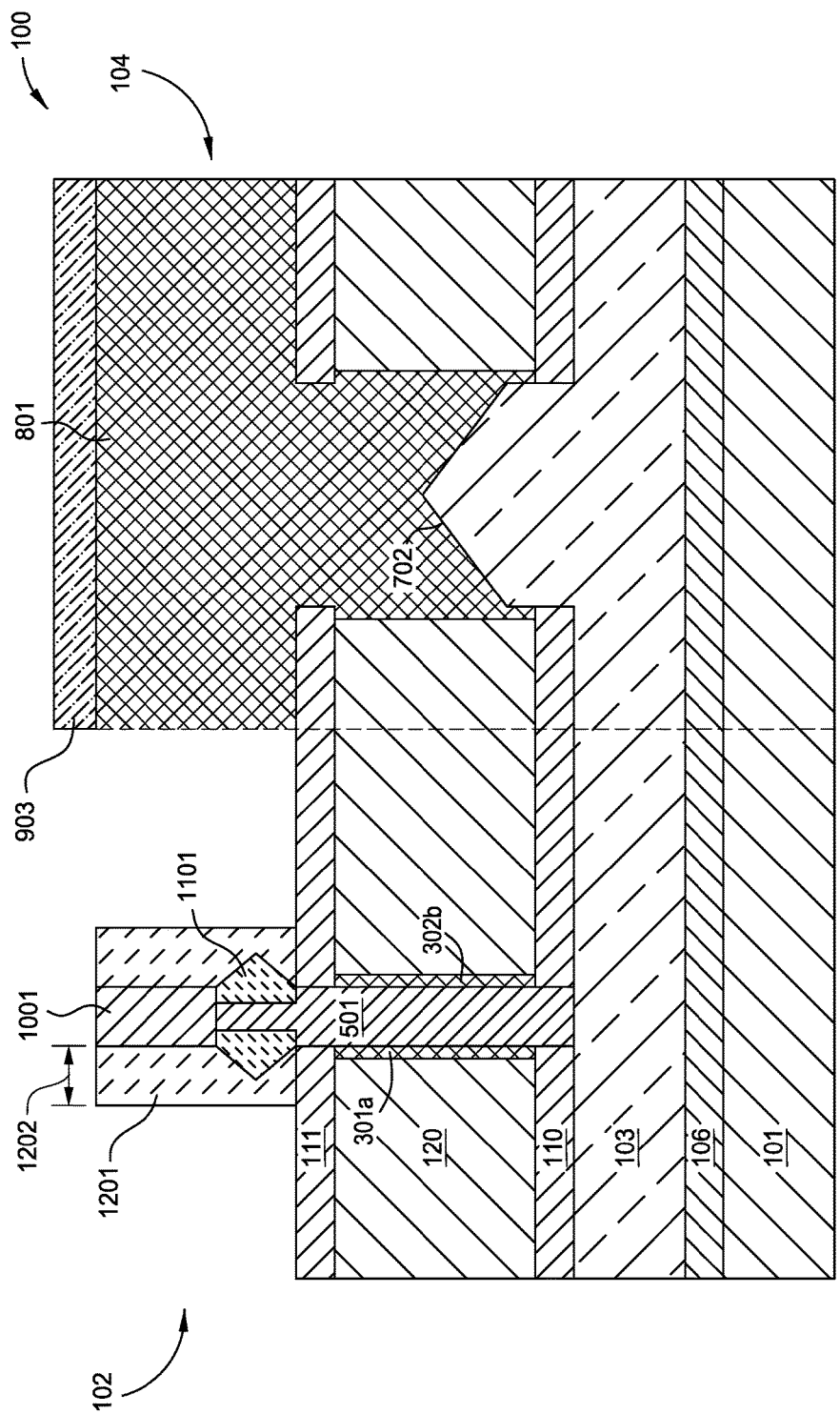

FIG. 12 is a cross-sectional side view of the semiconductor structure 100 after depositing a spacer 1201 on the epitaxial growth 801 in the transistor region 102. The spacer 1201 protects the epitaxial growth 1101 of the drain. The spacer 1201 is also disposed on a sidewall of the dielectric material 1001. The spacer 1201 includes an insulating material, for example, dielectric oxides (e.g., silicon oxide), dielectric nitrides (e.g., silicon nitride), dielectric oxynitrides, or any combination thereof. The spacer 1201 material is deposited by a deposition process, for example, chemical vapor deposition (CVD) or physical vapor deposition (PVD). The spacer material may be etched by a dry etch process, for example, a RIE process, such that it covers the epitaxial growth 1101 and is removed from a surface of the dielectric material 1001 and the second spacer 111. The spacer 1201 has a width 1202 of about 5 to about 50 nm, or from about 15 to about 30 nm.

Figure 13:
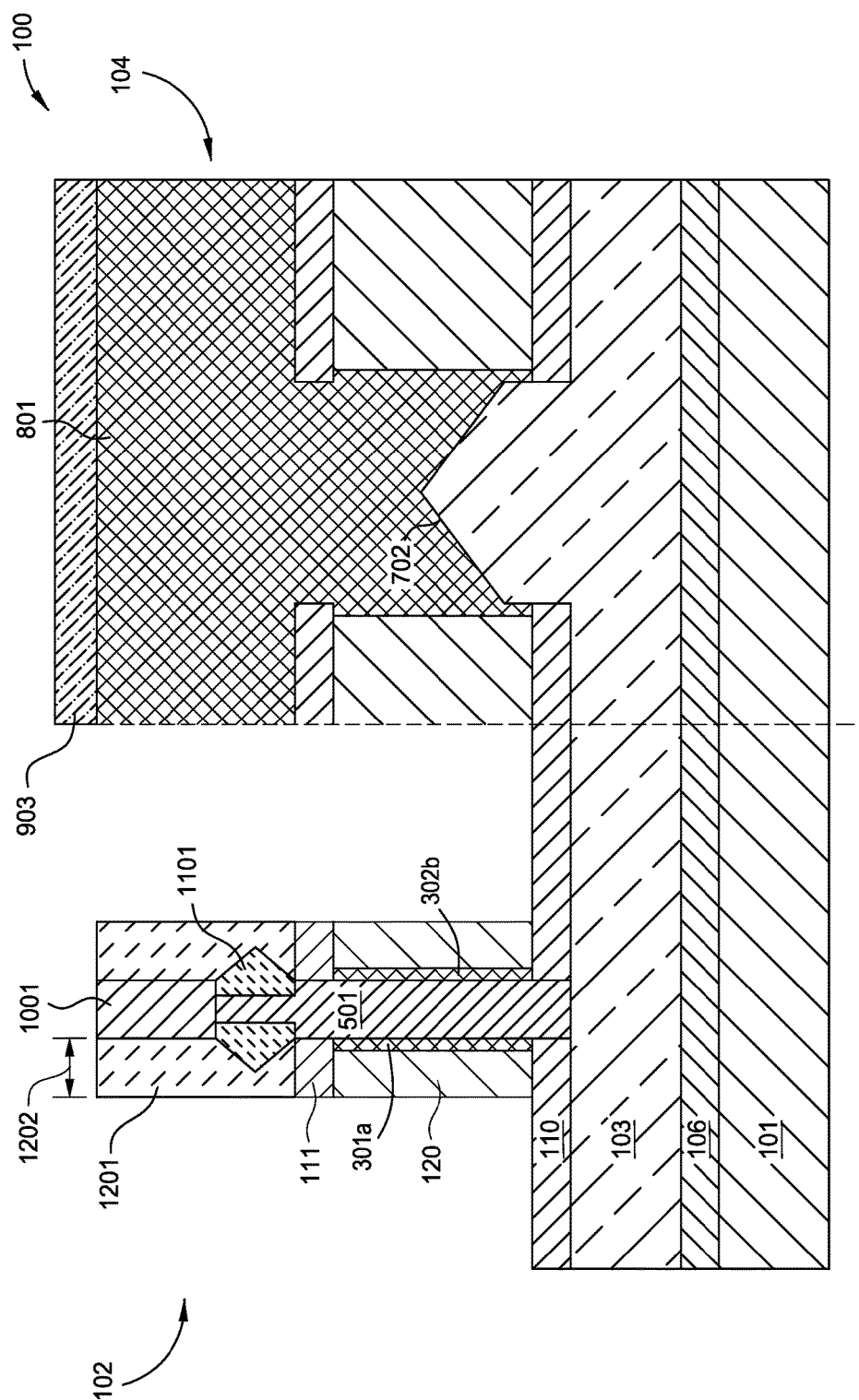

FIG. 13 is a cross-sectional side view of the semiconductor structure 100 after removing a portion of the second spacer 111 and dummy gate 120 in the transistor region 102. The second spacer 111 and the dummy gate material 120 are recessed to removed portions that extend horizontally beyond the spacer 1201 material. An etch process that is selective to (will not substantially remove) the first spacer 110 is performed. The etch process may be a dry etch process, such as a reactive ion etch (RIE) process.

Figure 14:
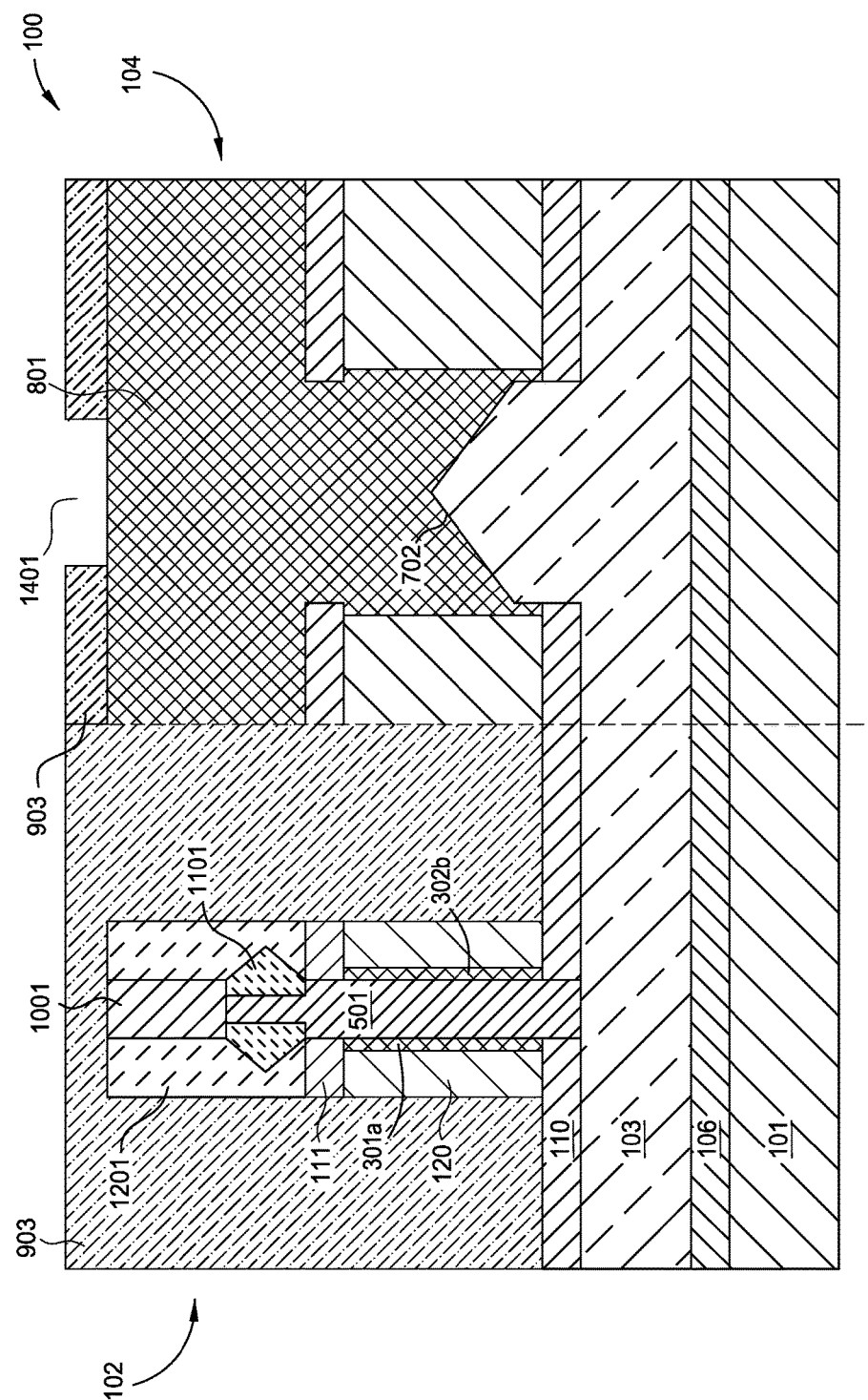

FIG. 14 is a cross-sectional side view of the semiconductor structure 100 after removing a portion of the hard mask layer 903 selective to the dielectric capping layer 130 in the anti-fuse region 104. The resulting opening 1401 is substantially aligned with the fuse regions 601. The width of the opening 1401 may be smaller than the width of the fuse regions 601. The opening 1401 may be formed by a wet etch process.

Figure 15:
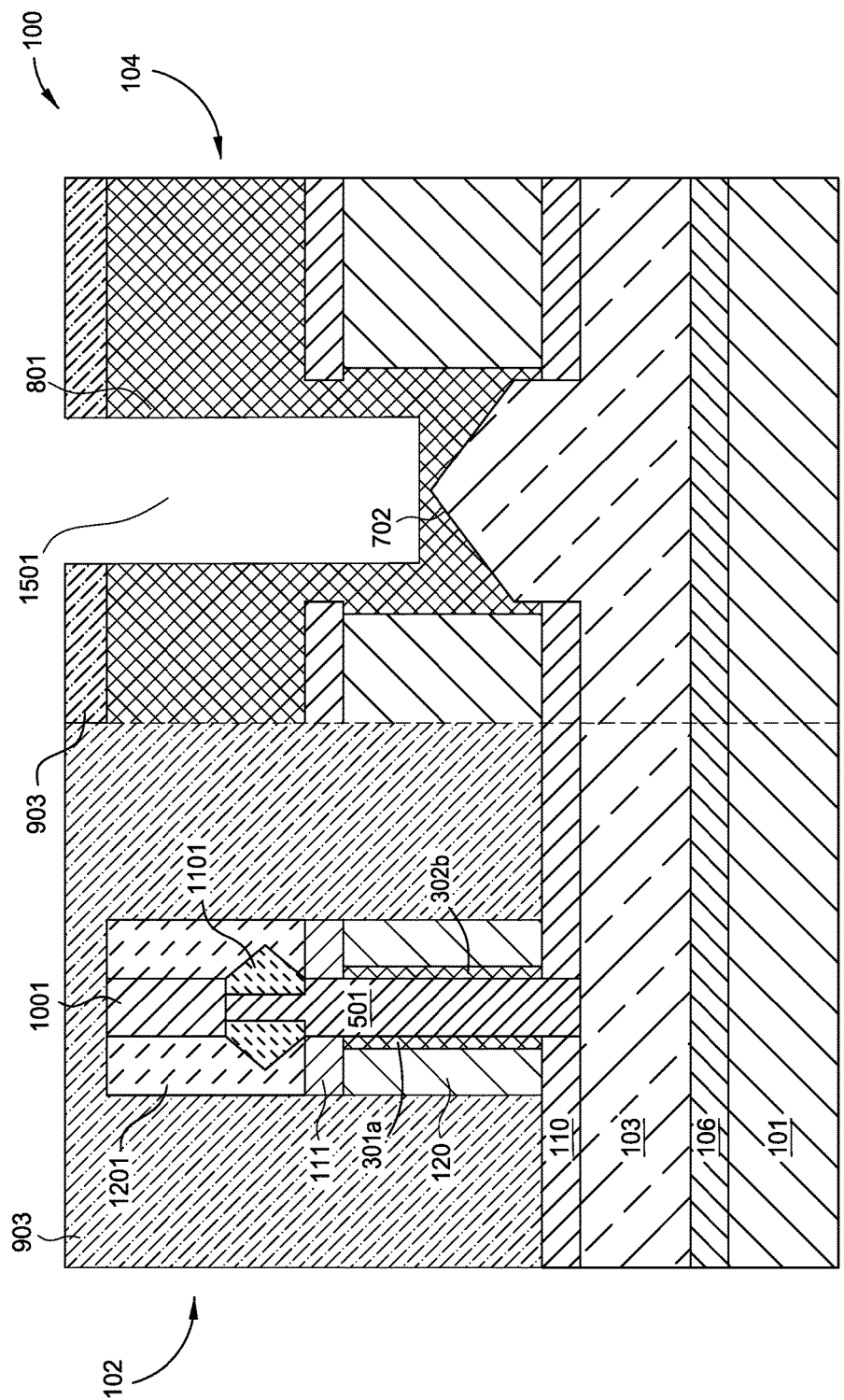

FIG. 15 is a cross-sectional side view of the semiconductor structure 100 after removing a portion of the dielectric capping layer 130 to within a distance of about 20 to 50 nm from the apex 603 of the fuse region 601 in the anti-fuse region 104 to form a trench 1501. The trench 1501 is further opened through the top spacer layer 110. The trench 1501 may be etched using an RIE process.

Figure 16:
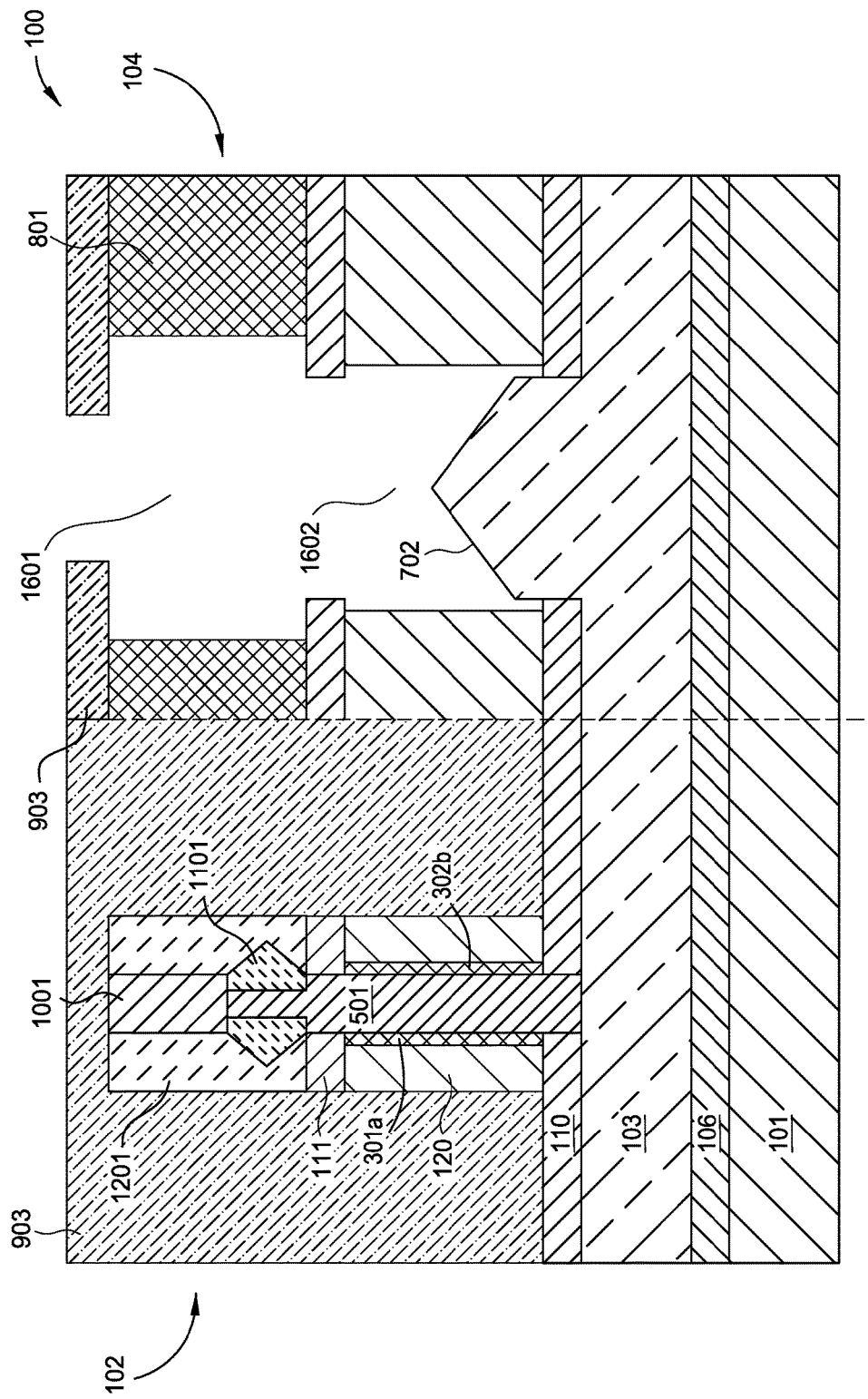

FIG. 16 is a cross-sectional side view of the semiconductor structure 100 after removing another portion of the dielectric capping layer 130 selective to the epitaxial channel 601 and the top spacer layer 110 in the anti-fuse region 104 to form an opening 1601 and an opening 1602 that forms the trench 1501. The opening 1601 may be wider than the opening 1602 of the fuse region 601. A wet etch process is employed to form the opening 1601, since an RIE etch would destroy the faceted shape of the fuse region 601.

Figure 17:
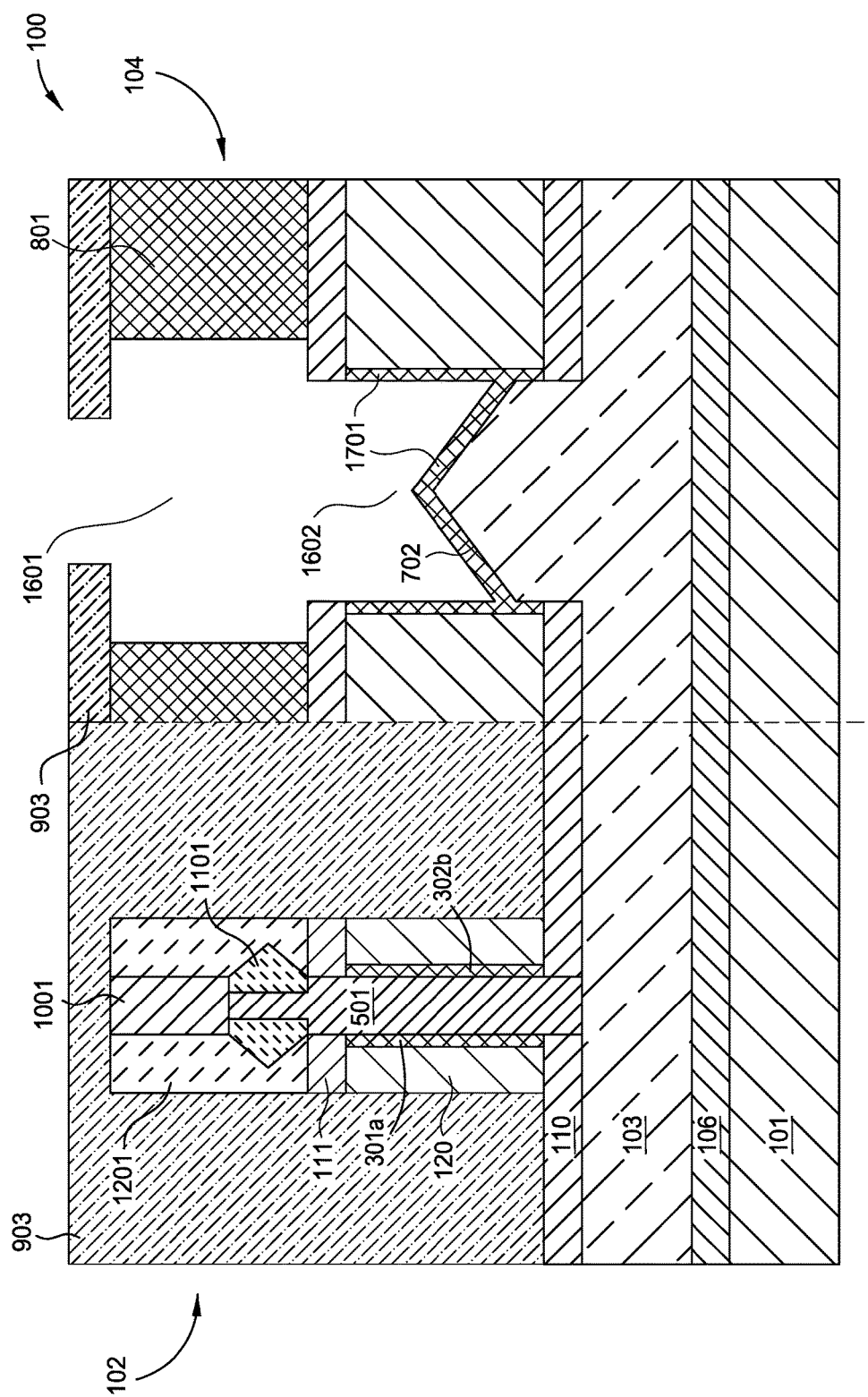

FIG. 17 is a cross-sectional side view of the semiconductor structure 100 after forming a dielectric layer 1701 aligned with the sidewalls of the dummy gate 120 and overlying the fuse region 601 and in the opening 1602 of the anti-fuse region 104. The dielectric oxide layer 1701 may be formed using a plasma oxidation process or any other method of oxidation.

Figure 18:
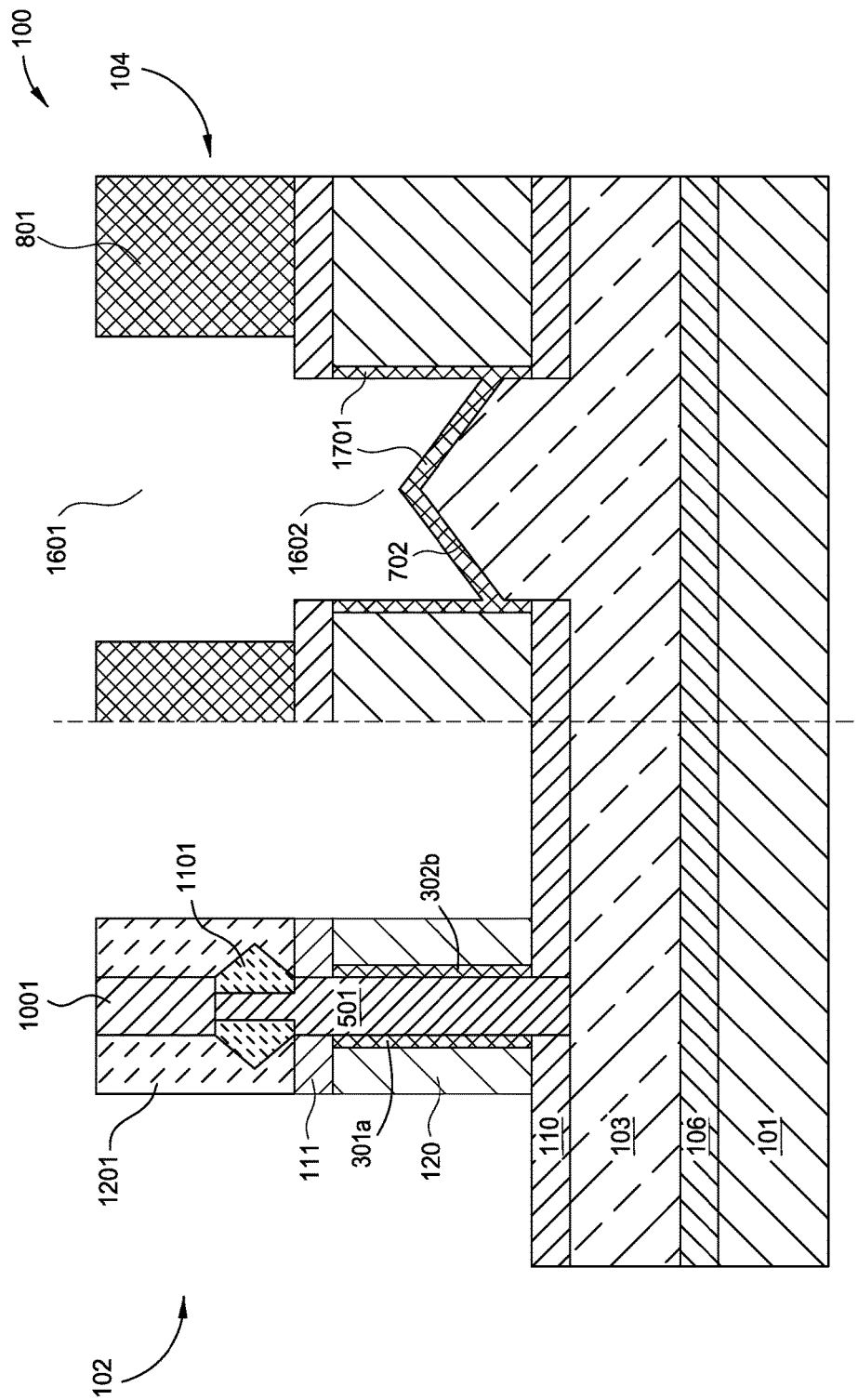

FIG. 18 is a cross-sectional side view of the semiconductor structure 100 after removing the remaining dielectric capping layer 130 in the anti-fuse region 104.

Figure 19:
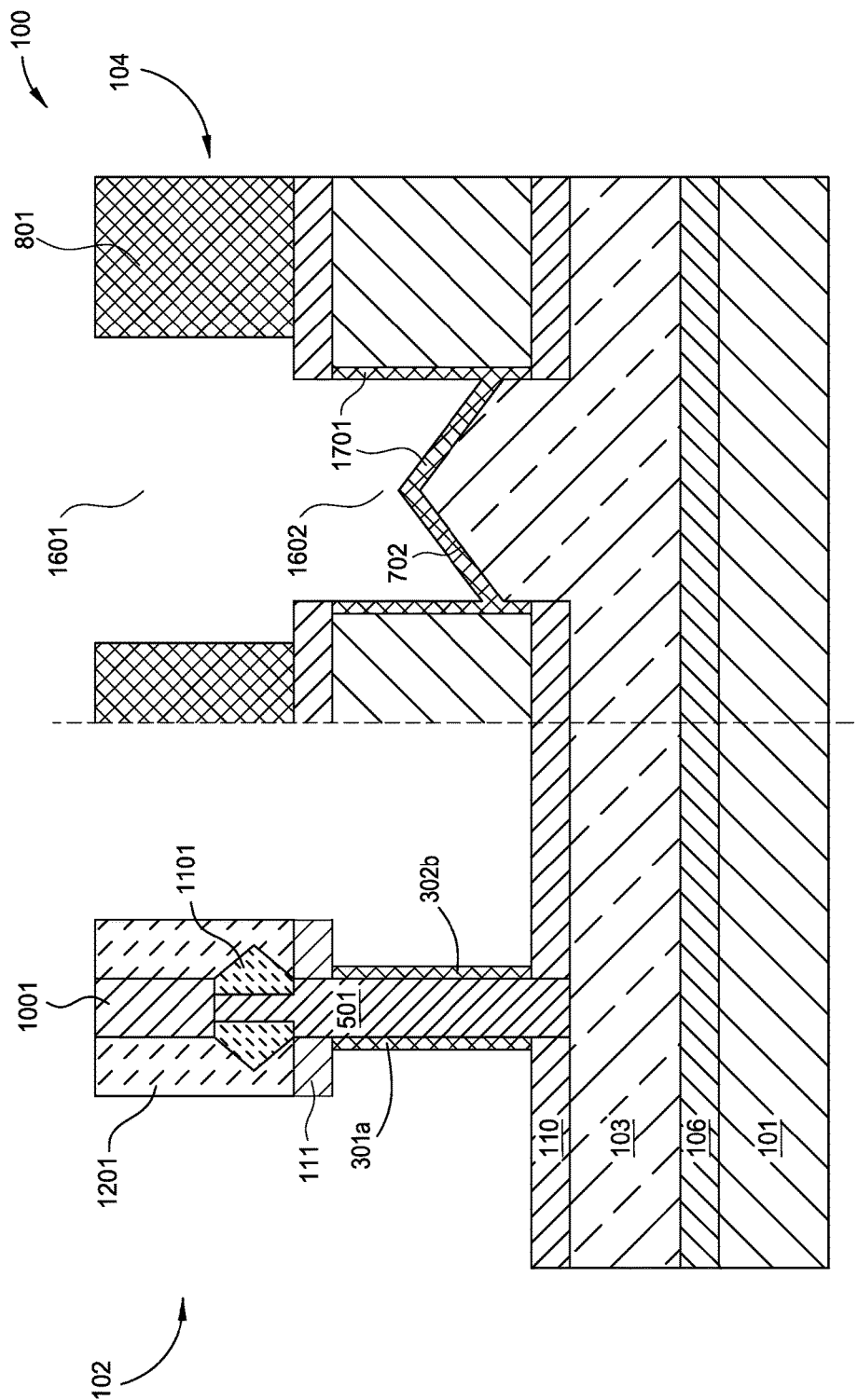

FIG. 19 is a cross-sectional side view of the semiconductor structure 100 after removing the remaining dummy gate layer 120 material beneath the spacer 901 to expose the oxide 401 in the transistor region 102, and removing the remaining portions of the hard mask layer 903 in the anti-fuse region 104. The dummy gate 120 material and the remaining portions of the hard mask layer 903 may be removed by a wet etch process, for example, a process that includes hot ammonia.

Figure 20:
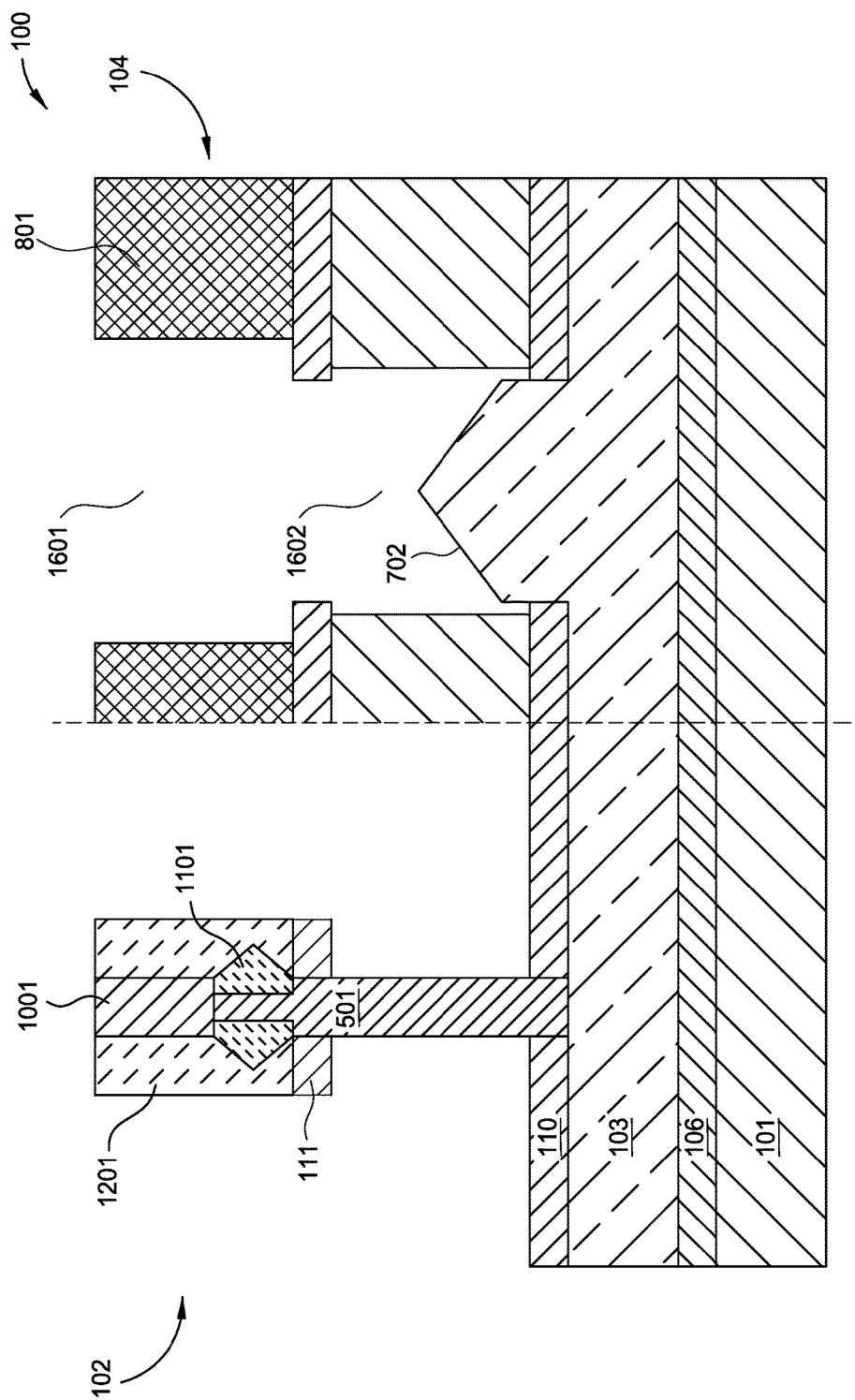

FIG. 20 is a cross-sectional side view of the semiconductor structure 100 after removing the dummy gate oxide 401 layer to expose the channel region 501 in the transistor region 102, and after removing the dielectric layer 1701 to expose the fuse region 601 in the anti-fuse region 104.

Figure 21:
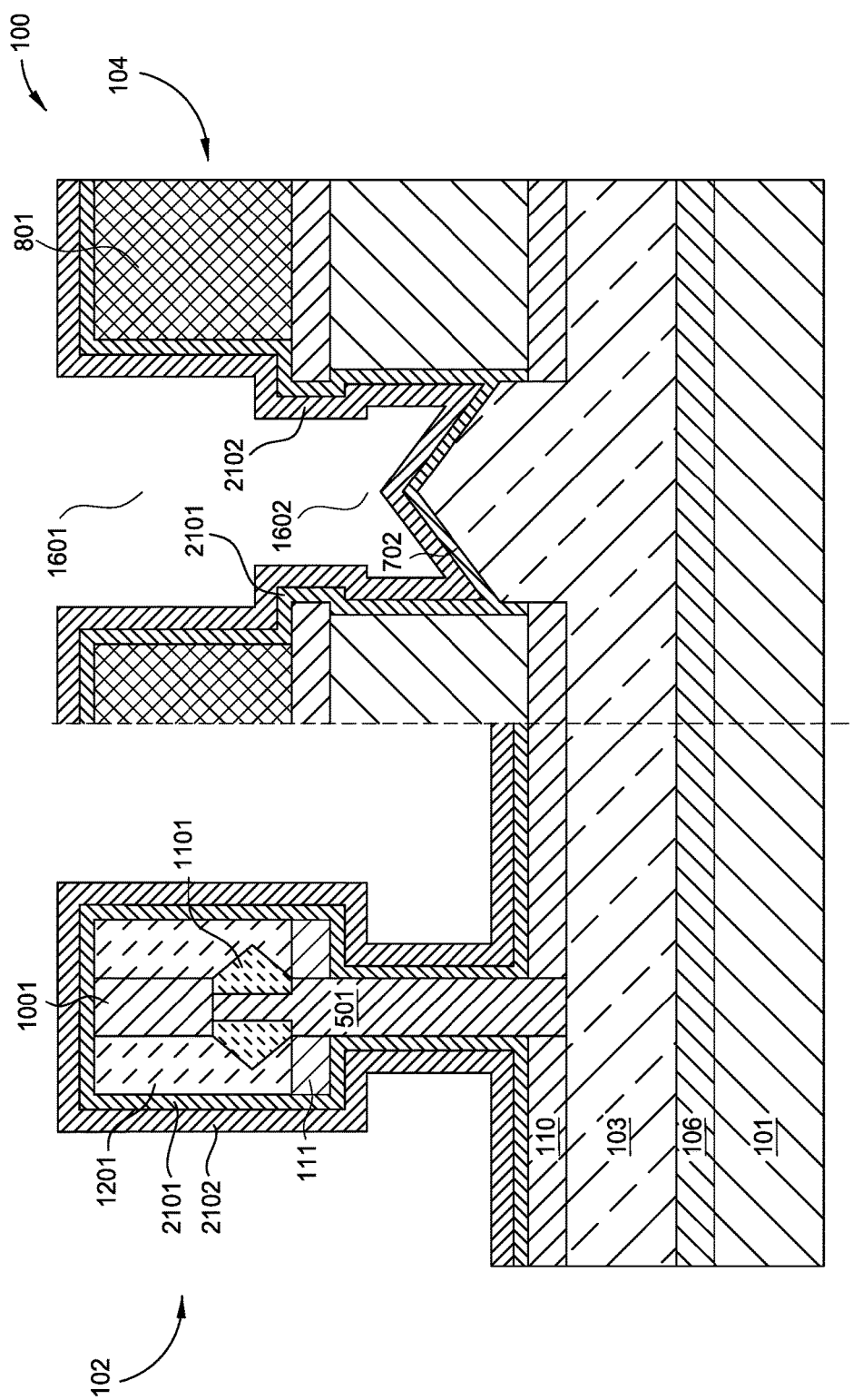

FIG. 21 is a cross-sectional side view of the semiconductor structure 100 after depositing a gate dielectric material 2101 and a work function metal 2102 in the transistor region 102 and the anti-fuse region 104. The dielectric material 2101 and the work function metal 2102 form a portion of the gate stack that replaces the dummy gate 120. The gate dielectric material 2101 and the work function metal 2102 are disposed on the bottom spacer layer 110, the channel region 501, the spacer 1201, and remaining portions of the bottom spacer layer 111 beneath the epitaxial growth 1101 in the transistor region 102. The gate dielectric material 2101 and the work function material 2102 are disposed on the remaining portions of the dielectric capping layer 130, the top spacer layer 110, the dummy gate 120, and the to the fuse region 601 in the anti-fuse region 104.

The gate dielectric material(s) can be a dielectric material having a dielectric constant greater than 3.9, 7.0, or 10.0. Non-limiting examples of suitable materials for the gate dielectric material 2101 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material 2101 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 2101 may vary depending on the deposition process as well as the composition and number of high-k dielectric materials used.

The work function metal(s) 2102 may be disposed over the gate dielectric material 2101. The type of work function metal(s) 2102 depends on the type of transistor. Non-limiting examples of suitable work function metals 2102 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 2102 may be deposited by a suitable deposition process, for example, CVD, PECVD, PVD, plating, thermal or e-beam evaporation, and sputtering.

Figure 22:
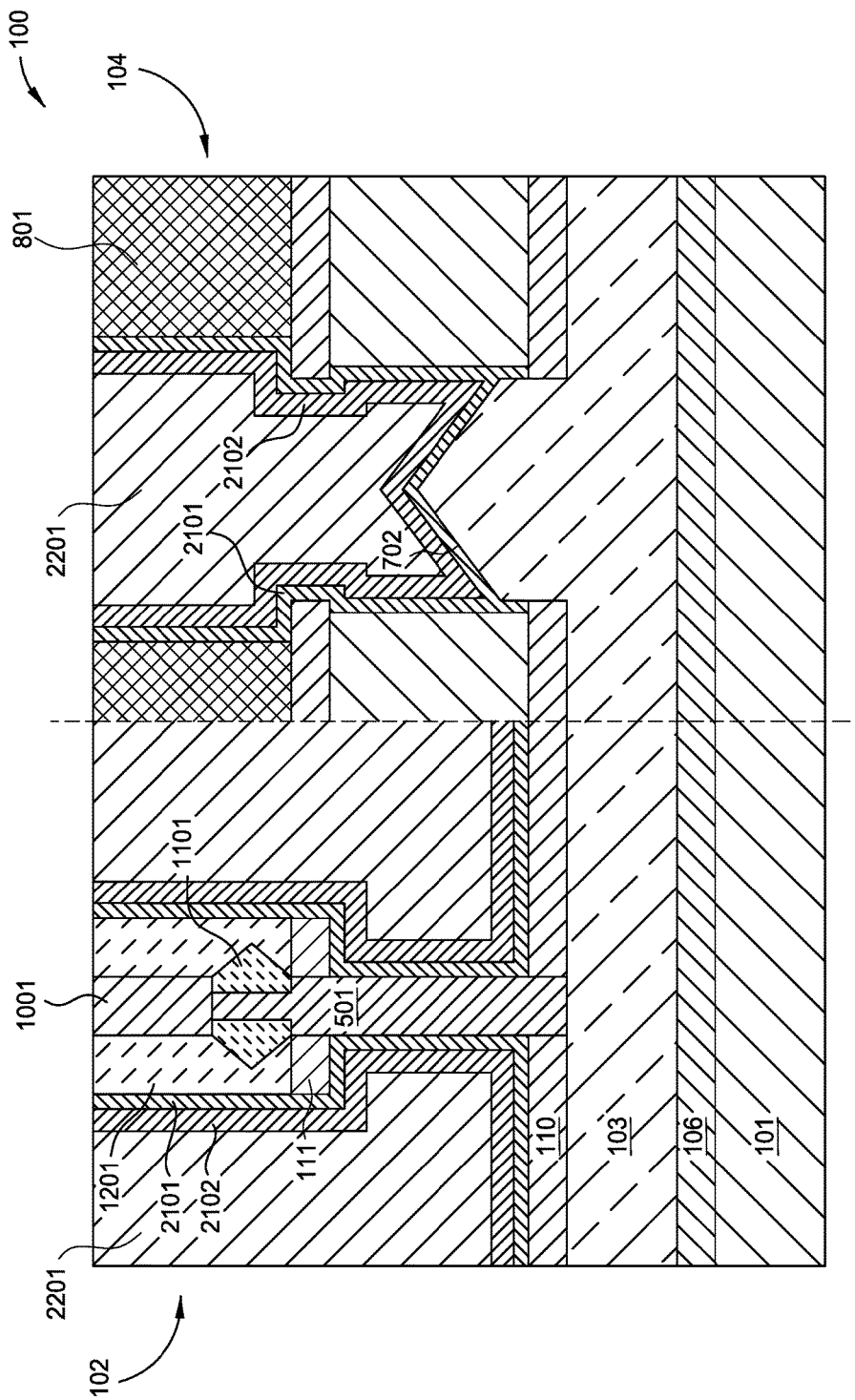

FIG. 22 is a cross-sectional side view of the semiconductor structure 100 after filling with a metal gate material 2201 and planarizing the metal gate material 2201 in both the transistor region 102 and the anti-fuse region 104. The metal gate material 2201 is a conductive gate metal that is deposited over the gate dielectric material(s) 2101 and work function metals 2102 to form the gate stack. Non-limiting examples of suitable conductive metals include aluminum (Al), platinum (Pt), tungsten (W), Cobalt (Co), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal material 2101.

Figure 23:
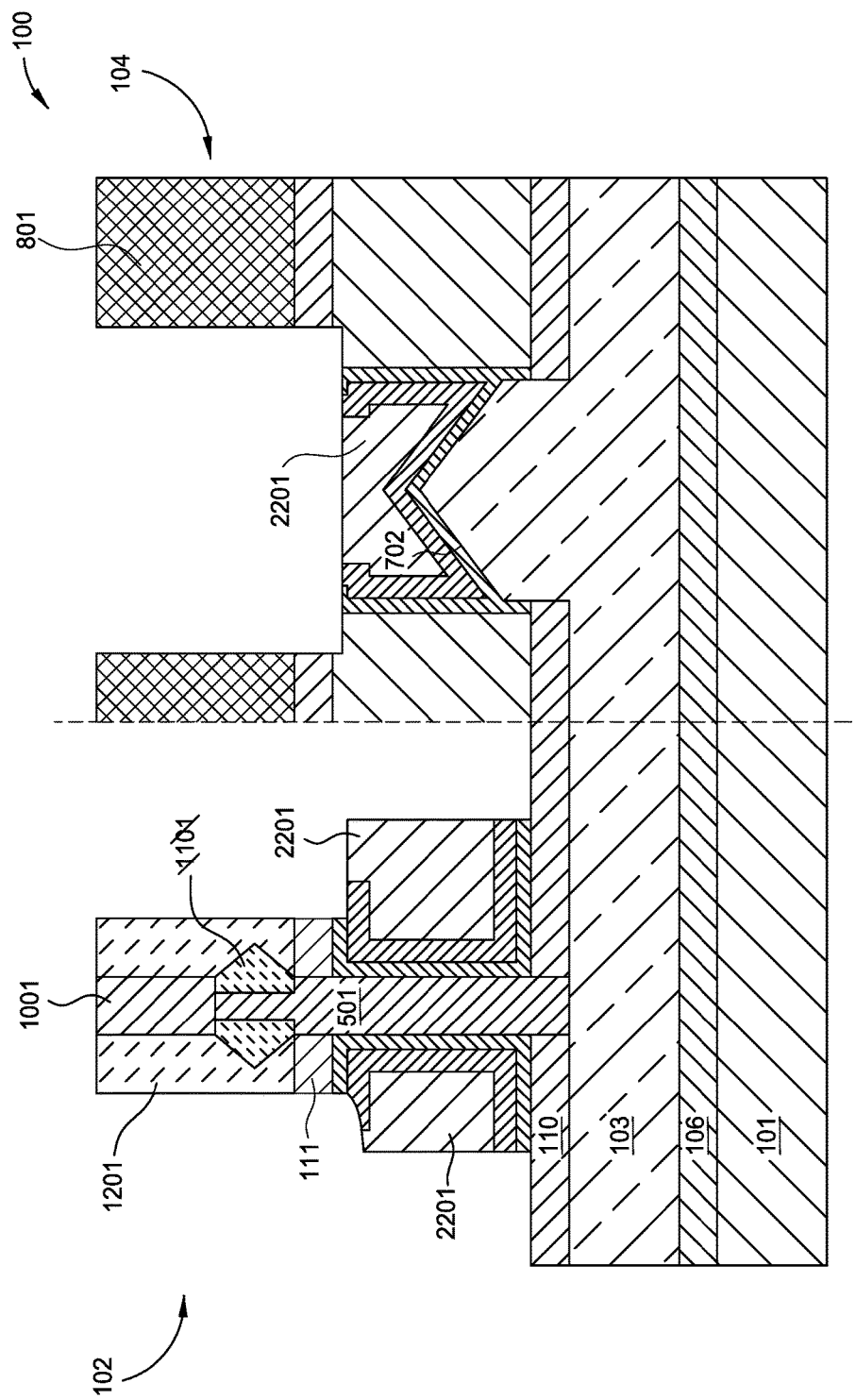

FIG. 23 is a cross-sectional side view of the semiconductor structure 100 after partially recessing the metal gate material 2201 in both the transistor region 102 and the anti-fuse region 104. The metal gate material 2201 is partially recessed by a gate lithography process and/or an etch process, for example, a reactive ion etch process.

Figure 24:
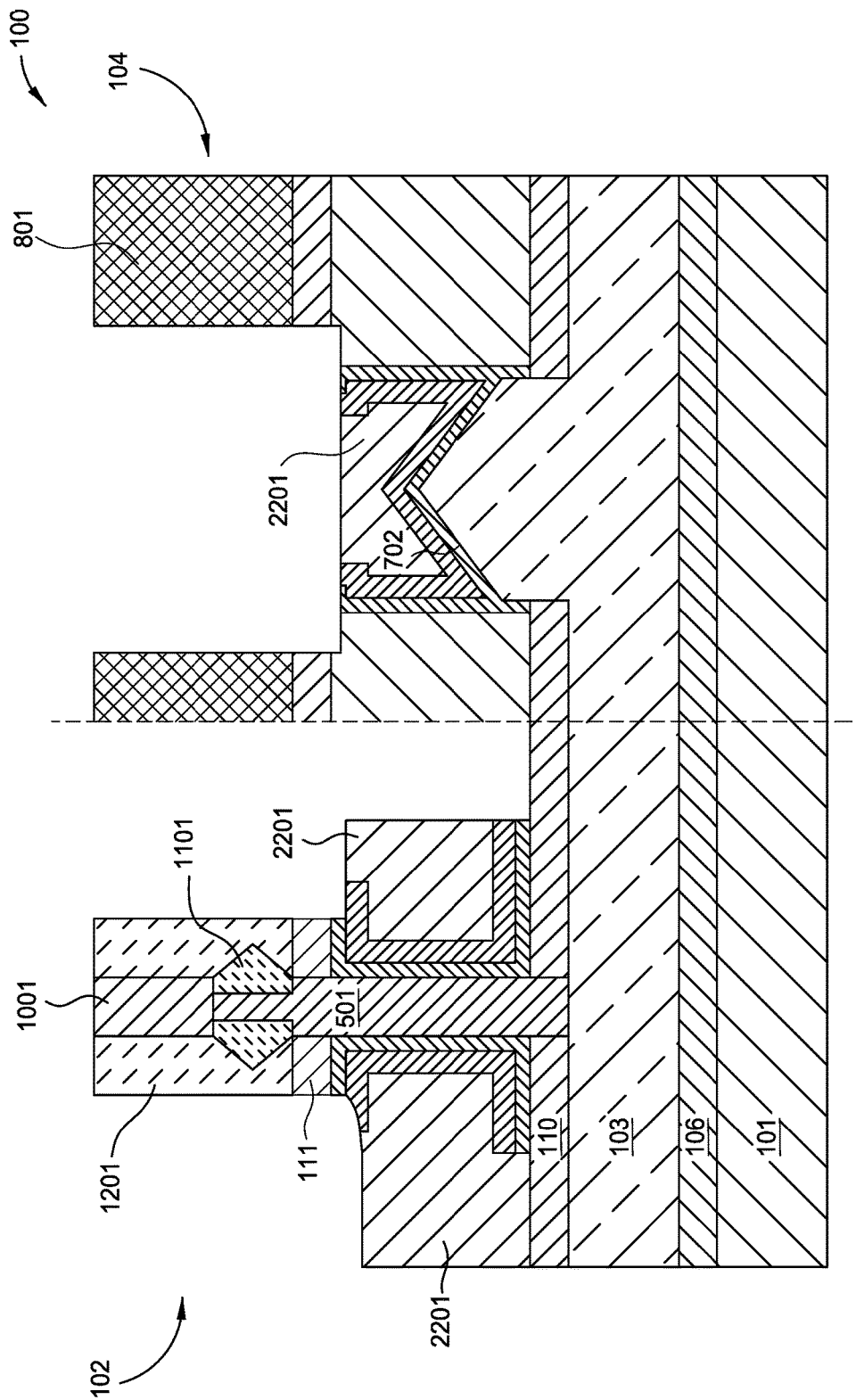

FIG. 24 is a cross-sectional side view of the semiconductor structure 100 after further etching the gate dielectric material 2101 and the work function metal 2102 in the transistor region 102. An anisotropic etch is performed such to recess the gate dielectric material 2101 and the work function metal 2102 down to the level of the metal gate material 2201. The anisotropic etch may be a RIE process.

Figure 25:
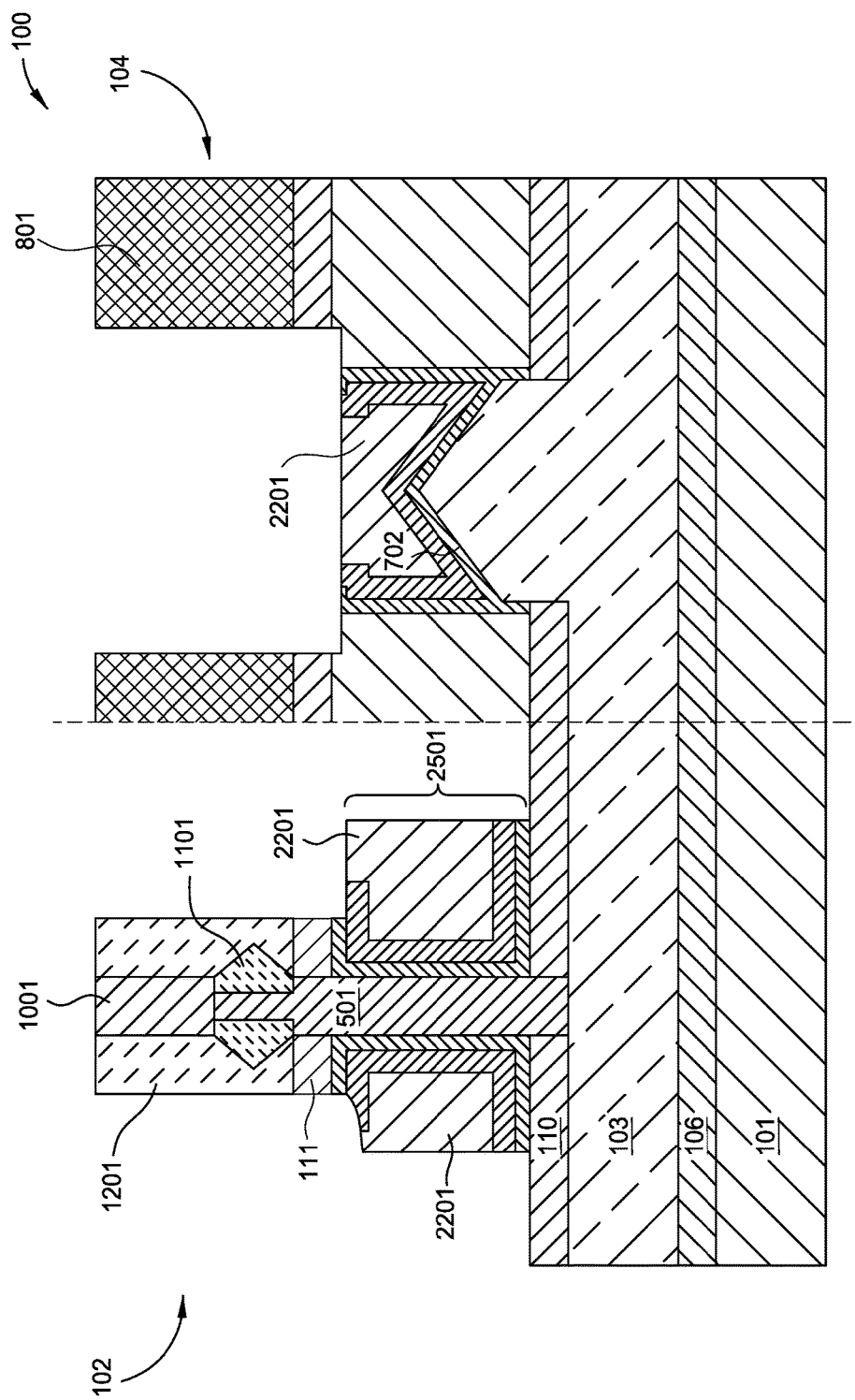

FIG. 25 is a cross-sectional side view of the semiconductor structure 100 after performing gate lithography and etching to form the gate 2501 in the transistor region 102. A mask may be disposed on the metal gate material 2201 and subsequently patterned. The pattern is transferred into the metal gate material 2201 to remove a portion of the metal gate material 2201 and define the gate 1601. In addition, the gate dielectric material 2101 and work function metal 2102 are also etched during this step. A combination of RIE processes may be performed. A portion of the first spacer 110 is arranged between the gate stack of the gate 1601 and the doped source 103.

Figure 26:
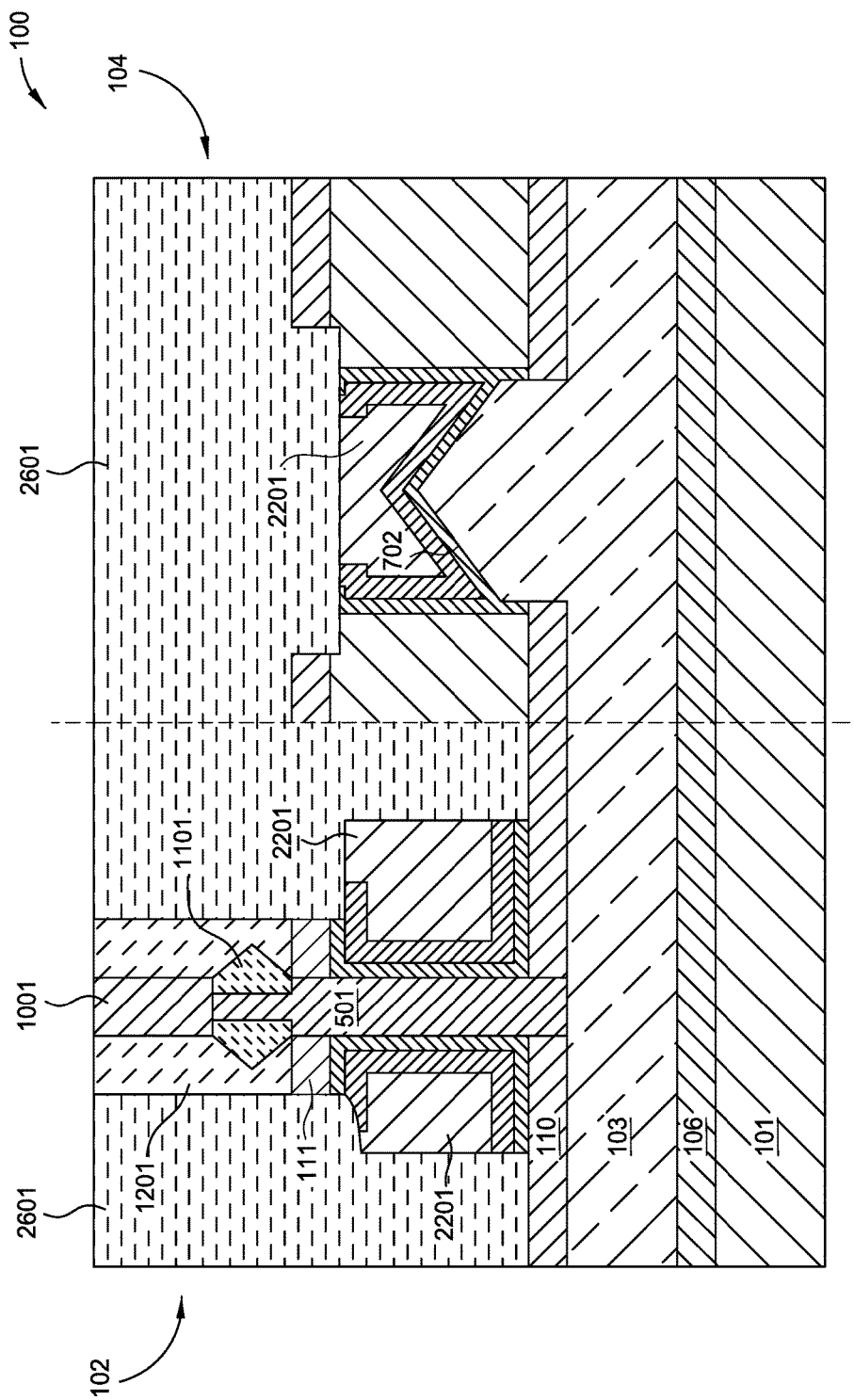

FIG. 26 is a cross-sectional side view of the semiconductor structure 100 after depositing an interlayer dielectric (ILD) 2601 on the gate 2501 in the transistor region 102. FIG. 26 is also a side view after depositing the ILD 2601, after an optional removal of the remaining portions of the dielectric capping layer 130, over the exposed portion of the top spacer layer 110, the dummy gate 120, and the to the fuse region 601 in the anti-fuse region 104. The ILD 2601 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD layer 2601 is deposited by a deposition process, including, but not limited to CVD, PVD, plasma enhanced CVD, atomic layer deposition (ALD), evaporation, chemical solution deposition, or like processes.

Figure 27:
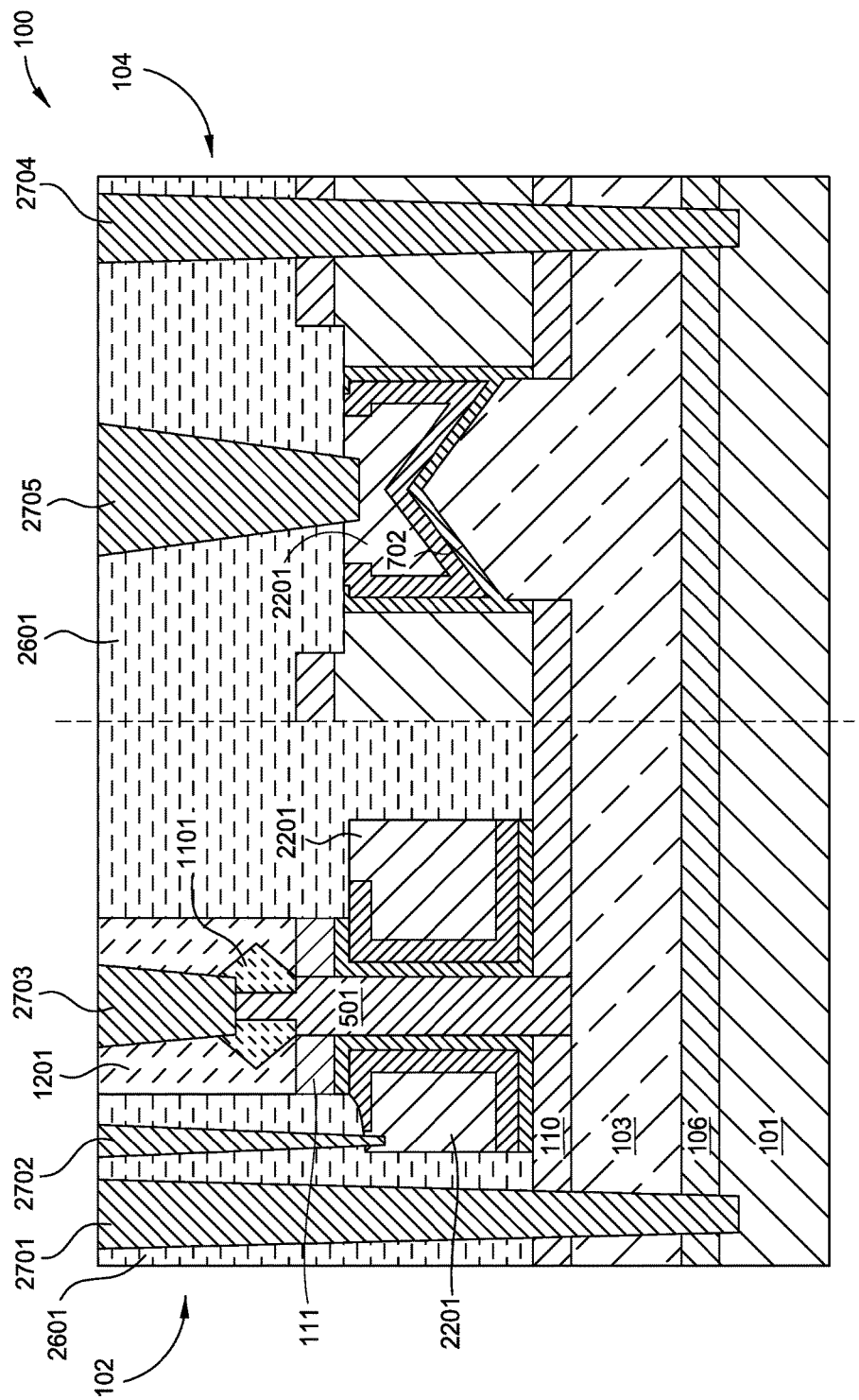

FIG. 27 is a cross-sectional side view of the semiconductor structure 100 after forming one or more source contacts 2701 over the doped source 103, forming one or more gate contacts 2702, and one or more drain contacts 2703 in the transistor region 102. FIG. 27 is also a cross-sectional side view after forming one or more source contacts 2704 over the doped source 103 and an anti-fuse contact 2705 over the fuse region 601 in the anti-fuse region 104. The source contacts 2701 extend through the ILD 1701 and top spacer layer 110 to the doped source 110 and are formed within a trench in the transistor region 102. To remove the ILD 1701 and form the source trenches, a resist, such as a photoresist, may be deposited and patterned. An etch process, such as a RIE, may be performed using the patterned resist as an etch mask to remove the ILD 1701 and first spacer 110 until the doped source 103 is exposed. The source trenches are filled with a conductive material or a combination of conductive materials. The conductive material filling may be a conductive metal, for example, aluminum (Al), platinum (Pt), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, chemical mechanical polishing (CMP) is performed to remove any conductive material from the surface of the ILD 1701.

The gate contacts 2702 extend from the surface of the ILD 1701 to the gate 1601 in the transistor region 102. The gate contacts 2702 are formed by patterning a trench in the ILD 1701. To remove the ILD 1701 and form the gate contact trenches, a resist, such as a photoresist, may be deposited and patterned. An etch process, such as a RIE, may be performed using the patterned resist as an etch mask to remove the ILD 1701 until the gate 1601 is exposed. The gate contact trenches are filled with a conductive material or a combination of conductive materials. The conductive material may be a conductive metal, for example, aluminum (Al), platinum (Pt), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 1701.

The drain contacts 2103 extend between the spacers 1201 to the epitaxial growth 1101 forming the drain in the transistor region 102. The dielectric material 701 is removed over the epitaxial growth 1101 to form a drain contact trench. To remove the dielectric material 701 and form the drain contact trenches, a resist, such as a photoresist, may be deposited and patterned. An etch process, such as a RIE, may be performed using the patterned resist as an etch mask to remove the dielectric material 701 until the epitaxial growth 1101 is exposed. The drain contact trenches are filled with a conductive material or a combination of conductive materials. The conductive material may be a conductive metal, for example, aluminum (Al), platinum (Pt), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 1701.

The source contacts 2104 extend through the ILD 1701 and top spacer layer 110 to the doped source 110 and are formed within a trench in the anti-fuse 102. To remove the ILD 1701 and form the source trenches, a resist, such as a photoresist, may be deposited and patterned. An etch process, such as a RIE, may be performed using the patterned resist as an etch mask to remove the ILD 1701 and top spacer layer 110 until the doped source 103 is exposed. The source trenches are filled with a conductive material or a combination of conductive materials. The conductive material filling may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 1701.

The anti-fuse contact 2705 extends from the surface of the ILD 1701 to the metal gate material 2201 overlying the work function metals 2102 and the fuse region 601 in the anti-fuse region 104. The anti-fuse contact 2705 is formed by patterning a trench in the ILD 1701. To remove the ILD 1701 and form the anti-fuse contact 2705 trenches, a resist, such as a photoresist, may be deposited and patterned. An etch process, such as a RIE, may be performed using the patterned resist as an etch mask to remove the ILD 1701 until the metal gate material 2201 is exposed. The anti-fuse contact 2705 trenches are filled with a conductive material or a combination of conductive materials. The conductive material may be a conductive metal, for example, aluminum (Al), platinum (Pt), tungsten (W), Cobalt (Co), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 1701.

The anti-fuse breakdown point 2706 may be located at the apex 603 of the fuse region 601 in the anti-fuse region 104. This results in an anti-fuse structure that has reduced breakdown voltage compared to typical semi-conductor anti-fuses because of electrical field enhancements in the anti-fuse structure due to its triangularly-shaped corners. The breakthrough voltage of the anti-fuse structure depends on a thickness of its dielectric and applied voltage. The breakthrough voltage for a typical anti-fuse is 2-4 Volts (current design). Related art semiconductor anti-fuses have oxide dielectric materials with a thickness in the range of 10-30 nm, with 20 nm being typical. An anti-fuse manufactured in accordance with embodiments of the present disclosure has a thickness in the range of 1.5-2 nm of high-k instead of low quality oxide. In current device structures having a nominal high-k thickness of 1.5-2 nm, the high-k dielectric breaks down at 2.5 Volts or above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A semiconductor device comprising a vertical transistor co-integrated with an anti-fuse, comprising:
   a highly doped source of a first conductivity type overlying a substrate;
   a counter-doped layer of a second conductivity type arranged between the highly doped source and the substrate;
   a first channel region extending over the highly doped source and comprising an epitaxial growth, the first channel region located at a first location on the substrate and having a first width;
   a drain comprising an epitaxial growth arranged on the channel region, the channel region extending from the highly doped source to the drain; and
   a highly doped fuse region extending over the highly doped source and comprising an epitaxial growth, the highly doped fuse region located at a second location on the substrate and having a second width that is larger than the first width.

2. The semiconductor device of claim 1, wherein the highly doped fuse region is implanted with ions.

3. The semiconductor device of claim 1, further comprising a gate stack overlying the highly doped fuse region, comprising:
   a high-k dielectric material layer;
   a work function metal layer overlying the high-k dielectric material layer; and
   a metal gate material overlying the work function metal layer.

4. The semiconductor device of claim 3, further comprising a first metal contact extending partially through the high-k dielectric material.

5. The semiconductor device of claim 3, further comprising an interlayer dielectric (ILD) layer overlying the gate stack.

6. The semiconductor device of claim 1, further comprising:
   a bottom spacer overlying the highly doped source excepting the first channel region and the highly doped fuse region.

7. The semiconductor device of claim 1, further comprising a second metal contact extending partially through the highly doped source.

8. The semiconductor device of claim 1, further comprising:
   a bottom spacer overlying the highly doped source excepting the first channel region and the highly doped fuse region.

9. A semiconductor anti-fuse, comprising:
   a highly doped source of a first conductivity type overlying a substrate;
   a counter-doped layer of a second conductivity type arranged between the highly doped source and the substrate; and a highly doped fuse region extending over the highly doped source and comprising an epitaxial growth, the highly doped fuse region implanted with ions.

10. The semiconductor anti-fuse of claim 9, further comprising a gate stack overlying the highly doped source, comprising:
   a high-k dielectric material layer;
   a work function metal layer overlying the high-k dielectric material layer; and
   a metal gate material overlying the work function metal layer.

11. The semiconductor anti-fuse of claim 10, further comprising a first metal contact extending partially through the high-k dielectric material.

12. The semiconductor anti-fuse of claim 9, further comprising a second metal contact extending partially through the highly doped source.

* * * * *